United States Patent [19]
Levran et al.

[11] Patent Number: 5,491,624
[45] Date of Patent: Feb. 13, 1996

[54] AC TO DC POWER CONVERSION SYSTEM

[75] Inventors: Alexander Levran, Los Angeles; Joseph M. Nowosielski, Laguna Hills; Giao M. Ton-That, Mission Viejo; Ramamoorthy Rajagopalan, Irvine, all of Calif.; Henri Mabboux, Eybens, France

[73] Assignee: Square D Company, Palatine, Ill.

[21] Appl. No.: 328,975

[22] Filed: Oct. 24, 1994

Related U.S. Application Data

[63] Continuation of Ser. No. 84,552, Jun. 29, 1993, abandoned.

[51] Int. Cl.$^6$ .................................................. H02M 7/155
[52] U.S. Cl. ................................. 363/87; 363/44
[58] Field of Search .................................. 363/44–48, 56, 363/87, 157, 159, 163, 164; 323/217, 218, 219

[56] References Cited

U.S. PATENT DOCUMENTS

| | | | |
|---|---|---|---|
| 3,395,327 | 7/1968 | Kaiser et al. | |
| 4,523,267 | 6/1985 | Mehl | 363/87 |
| 4,538,073 | 8/1985 | Freige et al. | 307/33 |
| 4,584,636 | 4/1986 | Ando et al. | 363/54 |
| 4,590,546 | 5/1986 | Maile | 363/37 |
| 4,719,550 | 1/1988 | Powell et al. | 363/37 |
| 4,751,398 | 6/1988 | Ertz, III | 307/66 |
| 4,816,985 | 3/1989 | Tanahashi | 363/81 |
| 4,818,891 | 4/1989 | Drinkwater | 307/64 |
| 4,849,950 | 7/1989 | Sugiura et al. | 363/48 |
| 4,961,130 | 10/1990 | Kirchberg, Jr. | 363/41 |
| 4,985,819 | 1/1991 | Mori et al. | 363/37 |
| 5,045,991 | 9/1991 | Dhyanchand et al. | 363/89 |
| 5,155,671 | 10/1992 | Inaba et al. | 363/47 |

OTHER PUBLICATIONS

Micro Linear Brochure (Phase Modulation/Soft Switching Controller, pp. 1–12).
A Three–Phase Soft–Switched High Power Density DC/DC Converter for High Power Applications.
Design Considerations for High–Voltage High–Power Full–Bridge Zero–Voltage–Switched PWR Converter.

*Primary Examiner*—Peter S. Wong
*Assistant Examiner*—Adolf Berhane
*Attorney, Agent, or Firm*—Michael J. Femal; Richard J. Graefe; James A. Henricks

[57] ABSTRACT

The present invention converts an alternating current input into a direct current output by switching a current load at high speeds to create a voltage envelope having a maximum allowed voltage and a minimum allowed voltage. Complementary switching elements are employed to take advantage of both the positive and negative portions of an AC cycle. Load switching is arranged so that the current vector which represents the load is nearly coincident with the voltage vector which represents the power source. The system can operate in an open loop mode at a constant frequency, in a closed loop mode, or in a hysteresis mode. During open loop operation, the voltage envelope is not rigidly defined as the switching frequency remains constant. During hysteresis mode control, the voltage envelope remains fixed and the current switching frequency varies.

27 Claims, 18 Drawing Sheets

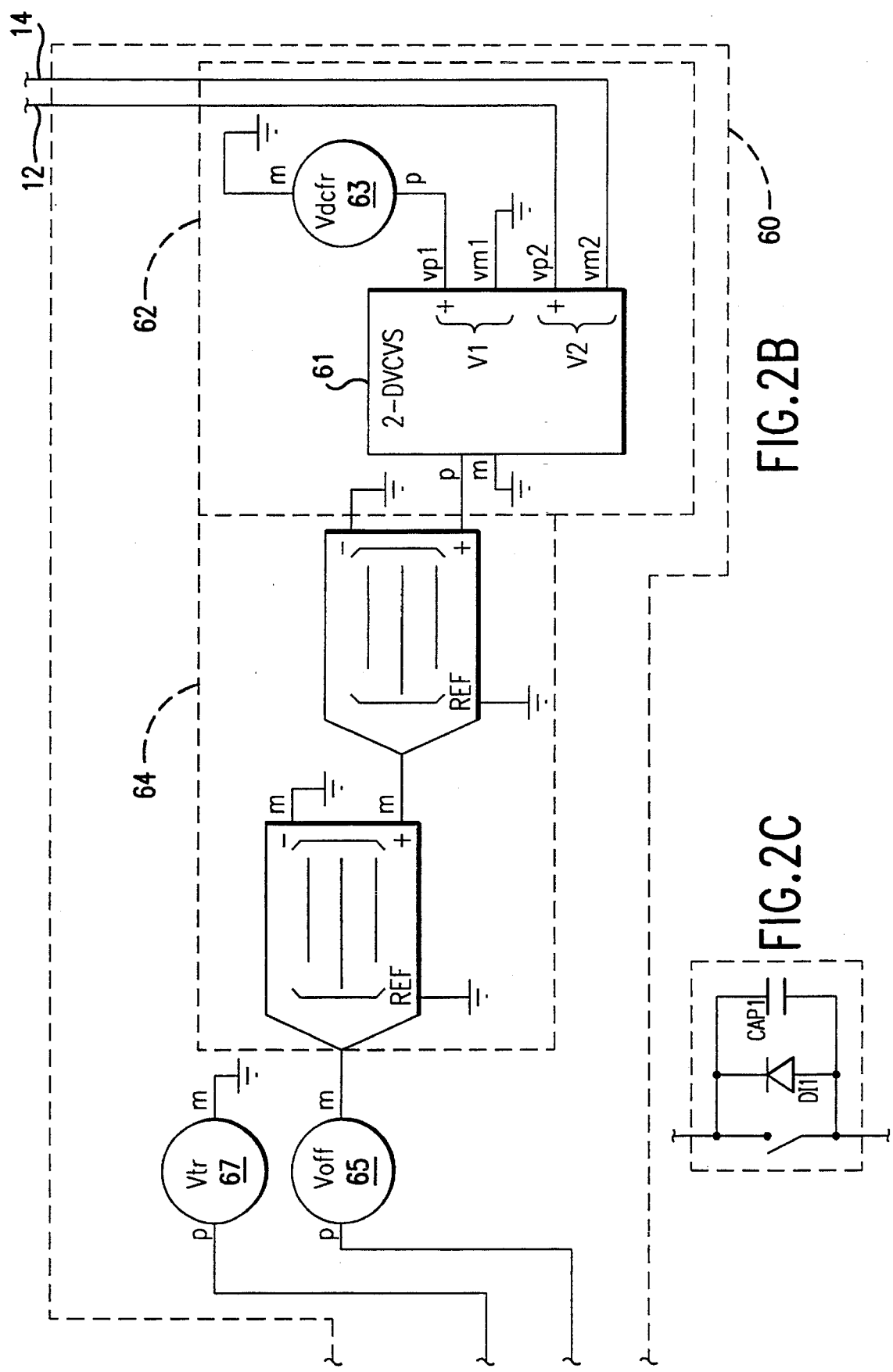

AC TO DC POWER CONVERSION SYSTEM

This application is a continuation of application Ser. No. 08/084,552, filed on Jun. 29, 1993 now abandoned.

FIELD OF THE INVENTION

The present invention relates generally to power supply systems, more specifically, to power conversion systems.

BACKGROUND OF THE INVENTION

Electrical power conversion systems have been of concern since the advent of electricity. It has been a greater concern since the advent of commercial transmission of electrical power. Electrical energy is usually transmitted in the form of alternating current (AC) at a frequency of 60 Hertz (Hz) and 110–120 Volts (rms.) in the United States, or 50 Hz and 220 Volts (rms.) in many other countries. Many appliances run directly off of the supplied voltage, such as light bulbs, toasters, motors, and the like.

Many appliances require conversion to a different voltage form in order to operate. 5 Volts and 12 Volts direct current (DC) is required for operation of personal computers. Microwave ovens use 5 Volts DC and higher voltages to run the microwave tube. Television sets require 10,000–50,000 Volts DC. In order to convert the power supplied by a source into a usable form to operate many modern appliances, various voltage conversion circuits are employed.

Because of the widespread demand for lower voltage operating devices, there has been some attention focused on distributing electrical power at or near the required voltage. Further, as numerous appliances in the home or office require low voltage, DC electrical power, it has been observed that the power conversion efficiencies of many devices are particularly low. In addition, it has been observed that conversion to a required voltage form can be more efficiently achieved at a central location than it can be at numerous remote locations. Distribution of low voltage electrical power can then be efficiently accomplished.

Attempts to solve power transmission problems and achieve greater efficiency include U.S. Pat. No. 4,751,398 issued to Ertz. Ertz describes a lighting system which converts 2 or 3 phase alternating current input to a direct current output. The direct current output is then distributed to several fluorescent lamp ballasts, which in turn drive fluorescent lamps. In addition, a battery backup system provides a DC power source to the fluorescent lamp ballasts in the event of AC power failure. While the AC power is operating, a battery charger maintains the power level of the battery.

U.S. Pat. No. 4,719,550 issued to Powell discloses a power conversion system dedicated to providing an uninterruptable power supply.

U.S. Pat. No. 4,590,546 issued to Maile discloses a circuit for providing a regulated DC voltage output from a wide range of AC inputs. The circuit relies on a voltage doubler to boost a low AC input level, and a full wave rectifier when the AC voltage is higher.

U.S. Pat. No. 4,538,073 issued to Freige discloses a power distribution system for use in desk top computers. The system provides a DC voltage to a number of remote modules which then regulate the voltage down to the required voltage level. Each of the remote modules are preselected for either 5 Volt or 12 Volt operation. All of the remote modules are driven by a common 33 kHz signal generator to force all of the remote modules to operate in unison and prevent feedback.

U.S. Pat. No. 4,961,130 issued to Kirchberg describes a pulse width modulation invertor which is intended to accommodate harmonic distortion through the use of "quick" or fast fourier transforms.

SUMMARY OF THE INVENTION

It is therefore an object of the present invention to provide an AC to DC power conversion system which is extremely efficient.

It is a further object of the present invention to provide a power conversion system which adjusts the switching time in order to apply a load synchronously with the input voltage waveform.

It is a further object of the present invention to provide a power conversion system which provides an output voltage which is stable and remains substantially unaffected by load switching.

It is a further object of the present invention to provide a power conversion system which can accommodate almost any line input voltage at almost any frequency with a minimum of correction.

It is a further object of the present invention to provide a power conversion system in which a load, especially a non-linear load, is effectively electrically isolated from the line distribution voltage, reducing or eliminating feedback to the distribution/line input voltage.

One embodiment of the present invention employs a high voltage switching network to generate a DC distribution voltage from a one or more phase AC supply. This circuitry is solid state, and does not employ a transformer. A feedback loop monitors the DC distribution voltage and selectively enables switching elements to select a desired input phase in order to maintain the DC distribution voltage. A feedback network may execute arithmetic functions in order to select a switching time that substantially eliminates a current component which is perpendicular to the voltage vector at the switching time.

The present invention can be operated without a feedback loop in an open loop configuration at high frequencies in a range of load and supply voltage variations.

DETAILED DESCRIPTION OF THE PREFERRED EMBODIMENT

Effective power conversion systems convert incoming electrical energy to a desired distribution waveform and voltage level. The illustrated embodiments discuss a three-phase alternating current input source operating at 60 Hz for U.S. operation. The system can be readily modified to operate at 50 Hz for overseas operation in those countries operating at 50 Hz. Similarly, the three phase nature of the illustrated embodiment can be readily modified to a two phase, single phase or a four or more phase operation by modifying certain component values, or the feedback loop in another embodiment.

A power conversion system must convert alternating current (AC) to direct current (DC). One embodiment of the present invention places an impedance between the incoming AC power and a series of switching elements which are selectively enabled to convert the incoming AC power to a DC output. The present invention is usable for any number of different phases of incoming AC power and may be operated in a fixed frequency mode or hysteresis mode. Feedback is needed for most applications envisioned, and there are several types of feedback which may be employed including pure demand based on the DC output voltage, and demand as modified to accommodate the instantaneous phase of the incoming AC power.

In fixed frequency mode, the switching elements in one preferred embodiment are switched on and off at a rate of approximately 8 kHz during the appropriate portion of the incoming AC wave form in order to distribute the load evenly among all AC power phases. Because the AC to DC converter can operate at different frequencies, another preferred embodiment of the invention has the converter operating at higher frequencies, such as about 18 kHz, which permits use of smaller components and higher conversion efficiencies. A line filter may be located between the incoming AC wave form and the switching elements to buffer the load from the incoming AC power and to provide adjustment of circuit values to accommodate different voltages, such as by providing multiple taps on inductors in the line filter.

Figure 1:
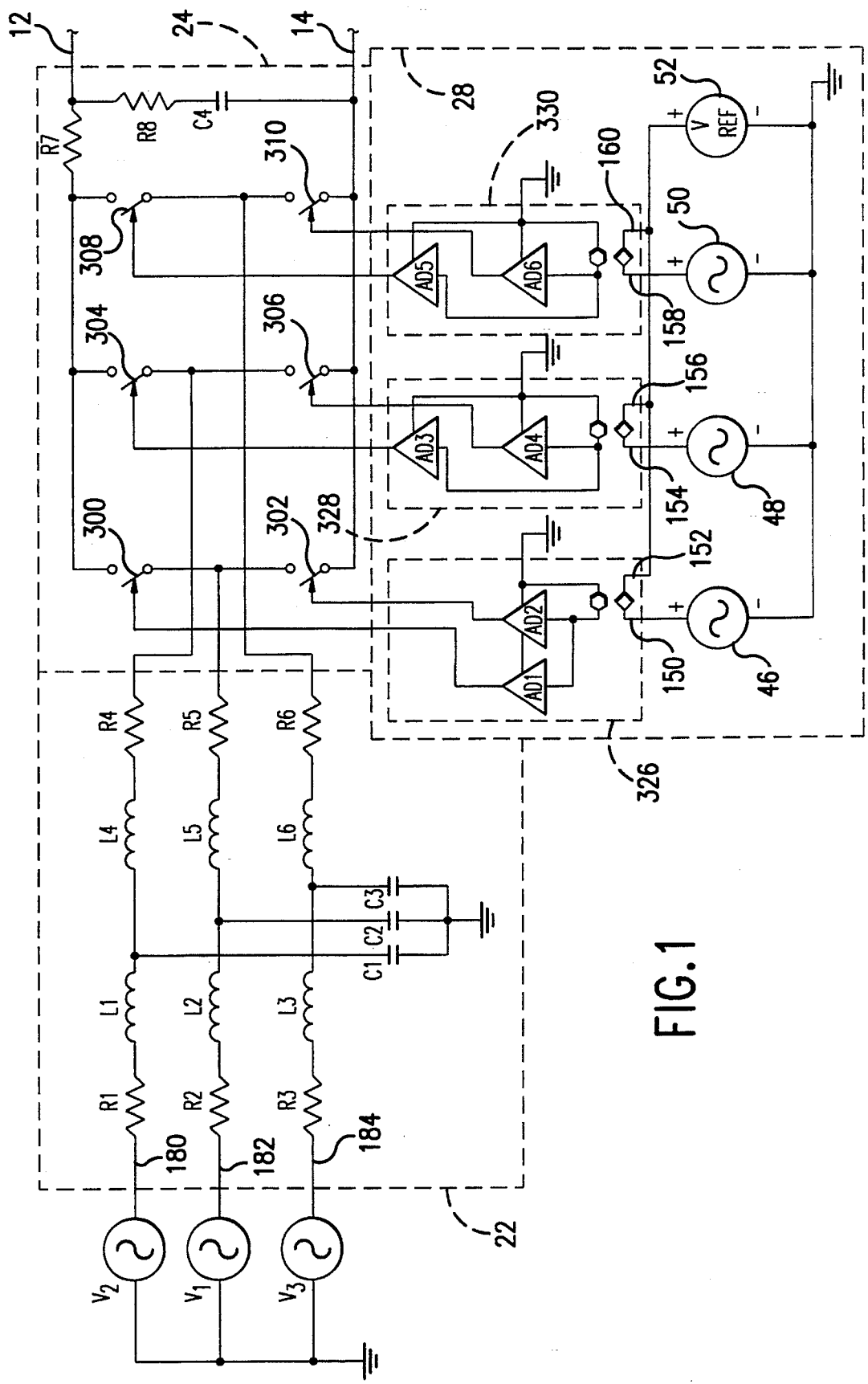
FIG. 1 is a schematic diagram of an embodiment of the power conversion system of the present invention without a feedback loop.

The embodiment of FIG. 1 may operate in a fixed frequency mode circuit. A three-phase input is shown labeled V1, V2 and V3 connected to a line filter 22 consisting of a series resistance and inductance network in association with a parallel capacitance network employed in association with each of the incoming phases of the power source, V1, V2, and V3.

Line filter 22 shifts the phase angle at which the load is applied to the incoming power sources, V1, V2 and V3. In one embodiment of the converter operating at a rated power of 15 kilowatts, L1, L2 and L3 are each 50 microHenri ($\mu$H) inductors, and L4, L5 and L6 are 100 $\mu$H inductors. In this configuration, C1, C2 and C3 are each 31.77 microFarad ($\mu$F) capacitors. Resistors R1, R2 and R3 indicate the small signal resistance of inductors L1, L2 and L3, respectively and are approximately 0.005 Ohms each. Similarly, resistors R4, R5 and R6 indicate the small signal resistance of inductors L4, L5 and L6, respectively and have approximately the same resistance as resistors R1, R2 and R3, 0.005 ohms. Line filter 22 is balanced to accommodate the switching frequency of the switching elements in 300, 302, 304, 306, 308 and 310, described below. The above values are calculated for a pulse frequency of 8 kHz, but the values will be different, as would be apparent to one skilled in the art, for different frequencies, such as 17.857 kHz and a different rated power. The converter operating at 8 kHz using the above circuit values achieves approximately a 1.2 degree phase shift. Different voltages can be accommodated by using inductors having multiple taps, which may be selectively used, such as by microprocessor control.

Switching matrix 24 is connected to the output of line filter 22. Switching matrix 24 provides highly efficient conversion of the supplied power wave form to a DC voltage which is output on DC bus lines 12 and 14. Switching matrix 24 consists of a pair of complementary switch elements for each phase of power supplied by V1, V2, and V3.

Each of the switching elements, 300, 302, 304, 306, 308, and 310 are electronic switching devices preferably an isolated gate bipolar transistor (IGBT) with an associated snubber circuit. The switching elements may include a snubber circuit as shown in FIG. 2(C) in conjunction with an IGBT. In the embodiment of FIG. 2(C) diode DI1 prevents a reverse, or negative voltage from being applied across the IGBT. Capacitor CAP1 is approximately 0.01 microFarad and provide a current path for reactive current components. Other suitable devices for this application include an MCT (MOS Controlled Thyristor) or a MOSFET for lower power applications.

The circuit can be configured to accommodate a wide range of frequency or power supply voltages, and a wide range of input voltage level. It is necessary to adjust the selection of the switching element of switching matrix 24 to accommodate a higher or lower voltage and, depending on the frequency selected, adjusting the inductive tap on the input filter of line filter 22.

Figures 1, 7A:
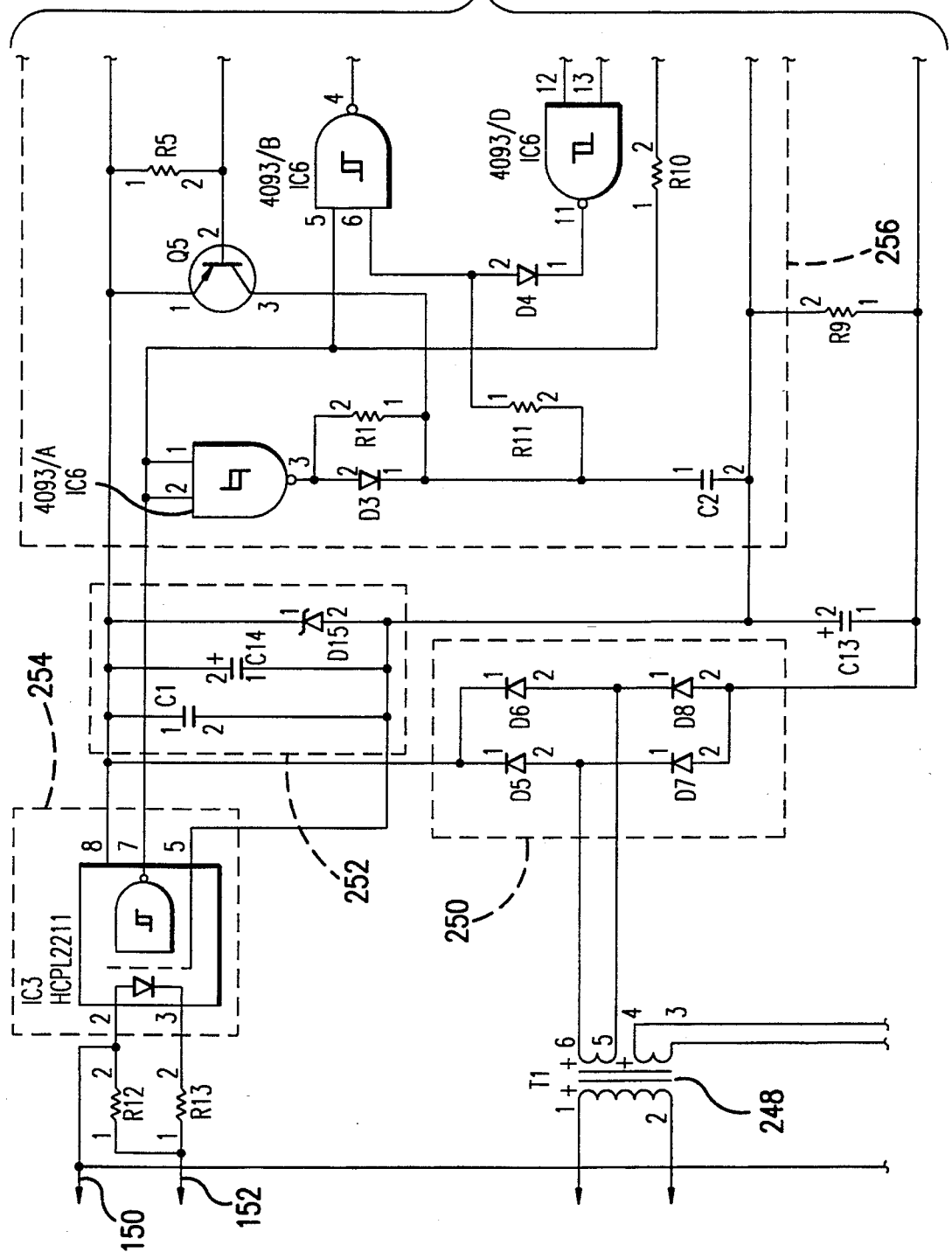
FIG. 7A and 7B illustrate an embodiment of a switching element controller.
Figures 2, 7A:
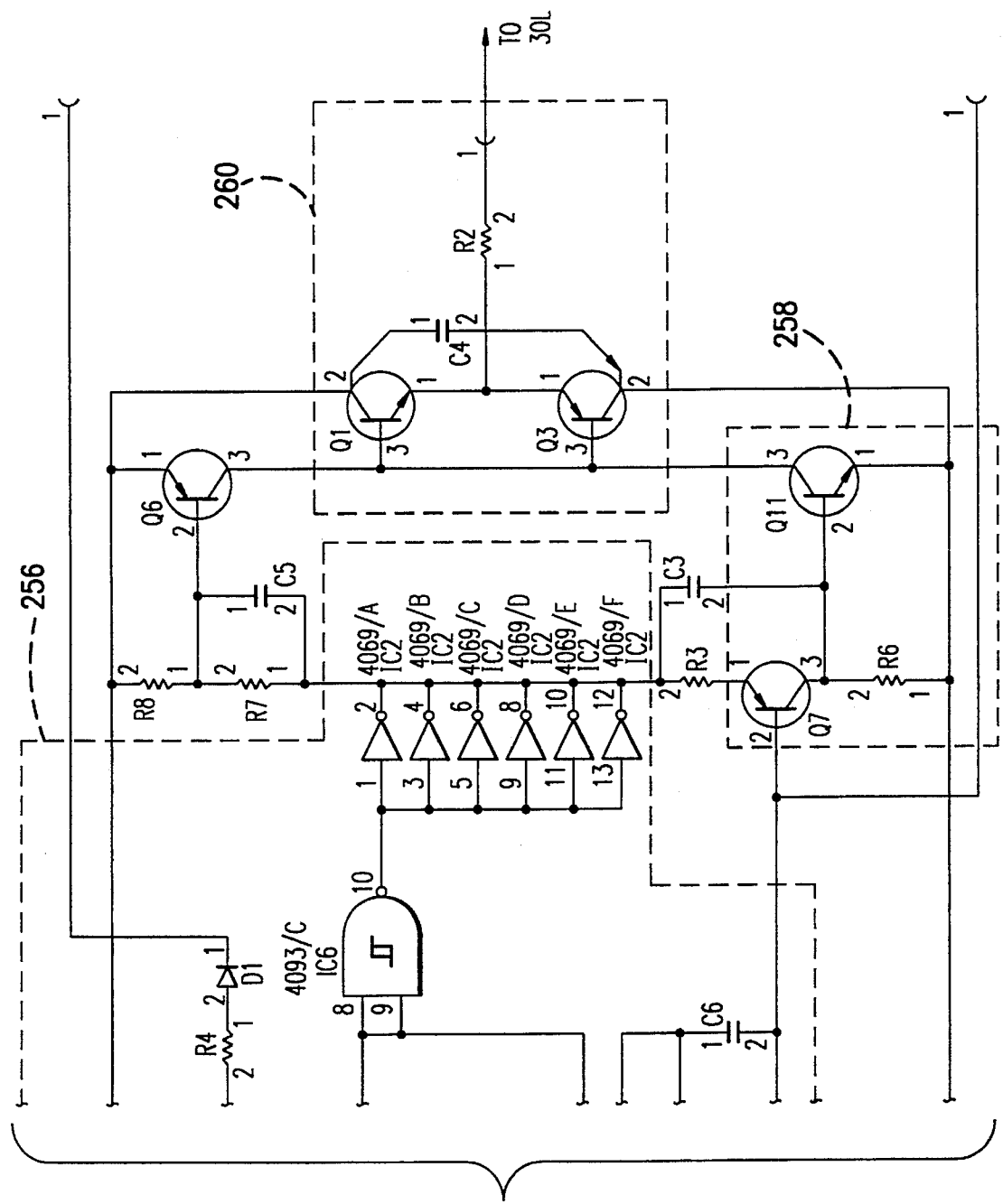
Figures 1, 7B:
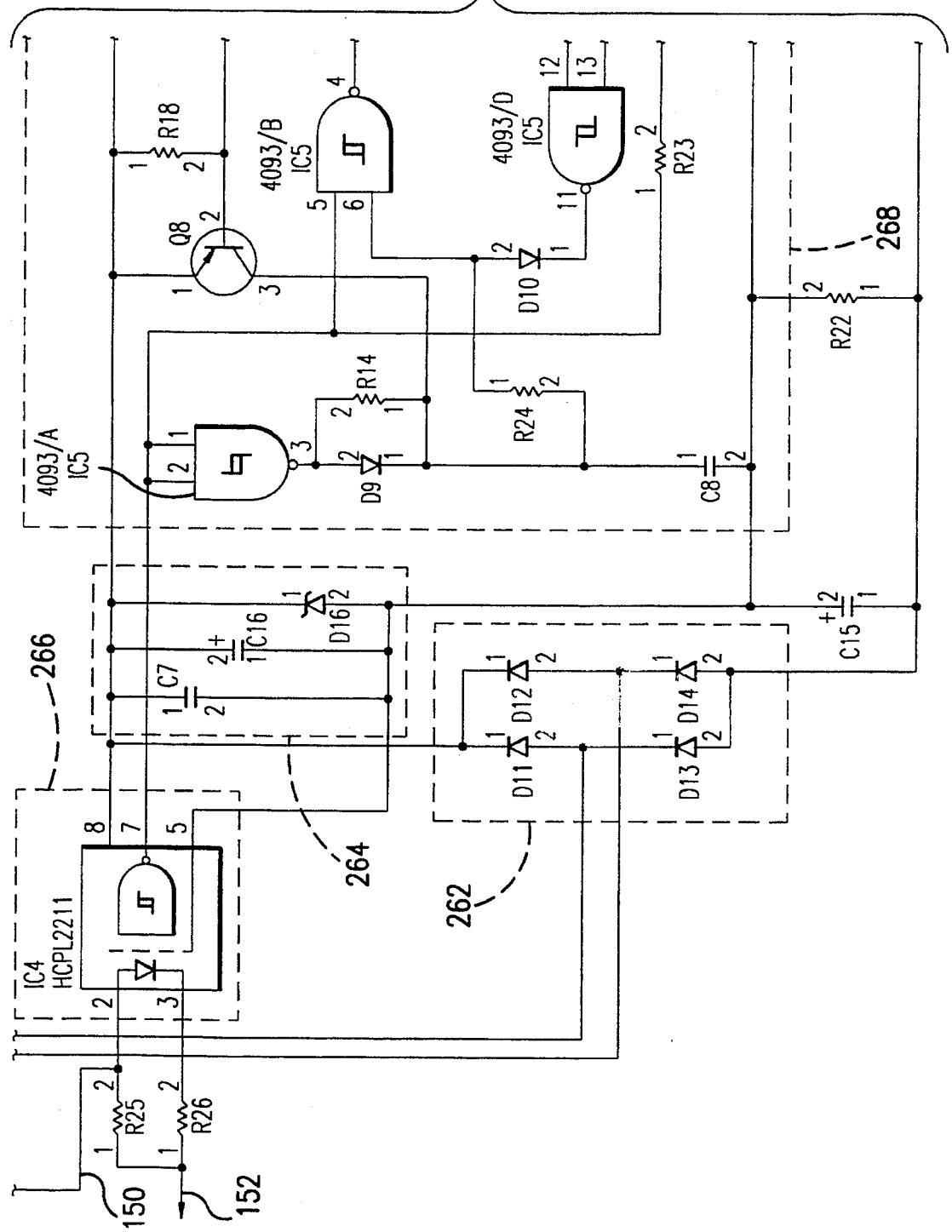
Figures 2, 7B:
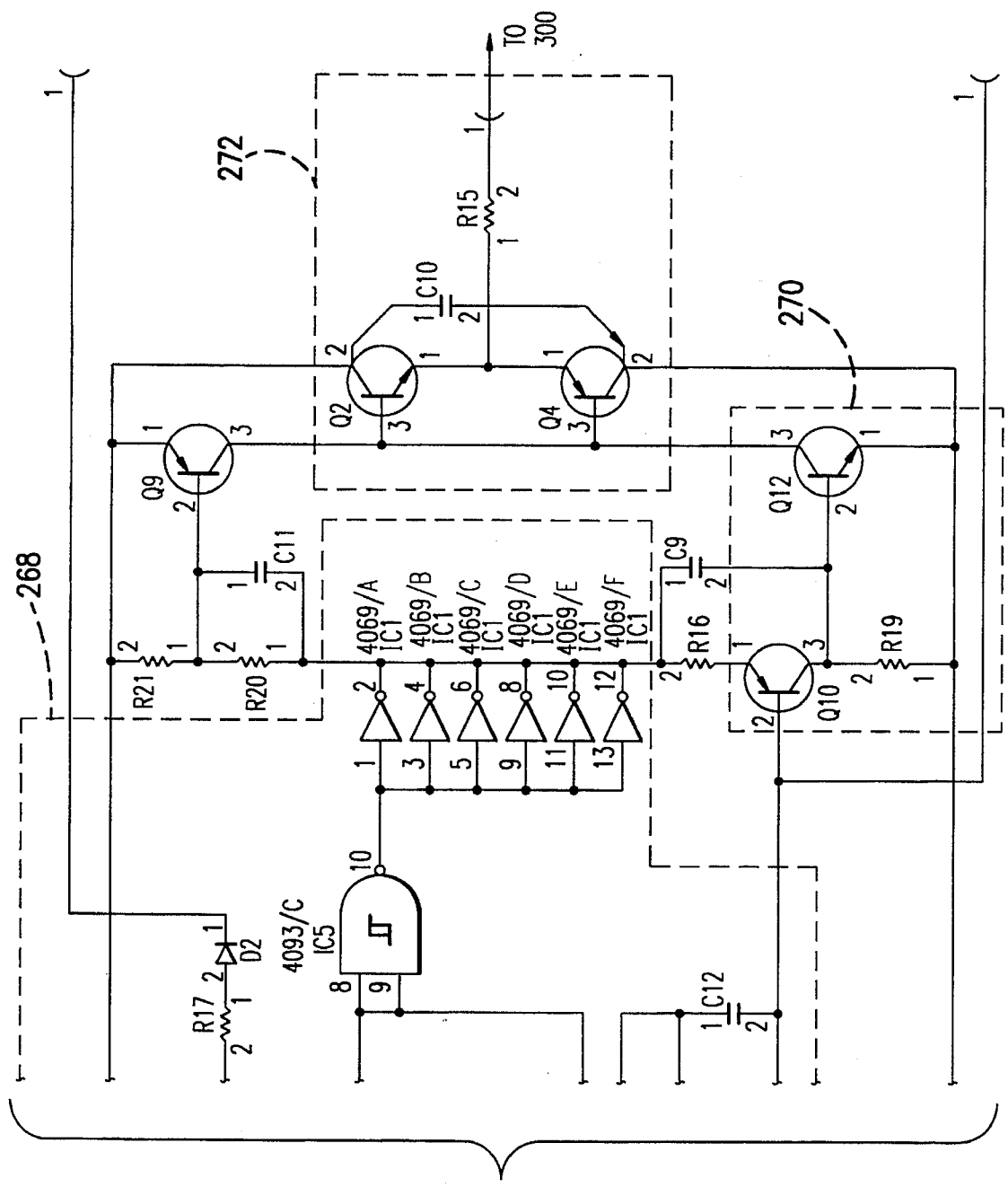

A first switching element 300, and a second switching element 302 regulate the power delivered by the first phase(V1). When switching element 300 is closed, the electrical energy delivered by source V1 is switched to a positive DC output line 12. When switching element 302 is closed, the electrical energy delivered by source V1 is switched to the negative DC output line 14. As can be appreciated, it is undesirable to have both switching element 300 and 302 enabled at the same time. Doing so would present a short circuit between the positive DC line 12 and the negative DC line 14. To avoid this, switching elements 300 and 302 are driven by switch control circuit 326. Similarly, switching elements 304 and 306 are driven by switch control circuit 328, and switching elements 308 and 310 are driven by switch control circuit 330. A more detailed illustration of an embodiment of switch control circuits 326, 328 and 330 is shown in FIGS. 7A and 7B.

The embodiment shown in FIG. 1 illustrates the power processing portion of the power conversion and distribution system, including the switching device drivers. There is no feedback from the DC output which controls selection of power source phases. To activate the switching elements 300 and 302 at an appropriate time, a reference signal is synchronized with incoming power source V1, such as by Hall effect sensors as discussed below. The synchronized reference signal generator 46 controls switching of power source V1 through switching elements 300 and 302. Similarly, reference signals 48 and 50 control switching of power through switching elements 304,306 and 308,310 for incoming power sources V2 and V3, respectively.

When a load is connected across DC output lines 12 and 14, the power processing portion of the circuitry, as shown in FIG. 1, can be driven in an open loop configuration. An oscillator and driver circuit 28 ensures that current loading of the supply lines is switched at regular intervals.

Command signal sources 46, 48, 50 and 52 are employed to control activation of switching elements 300, 302, 304, 306, 308 and 310. Command signal sources 46, 48 and 50 are each of the same frequency as the incoming AC power V1, V2 and V3, respectively. For a 60 Hz incoming AC signal, command signal source 46 will be a 60 Hz AC signal which is synchronized with the incoming AC power V1. Synchronization will occur with the incoming power, and not the phase delayed signal which has passed through line filter 22. Similarly, command signal source 48 is synchronized with incoming AC power V2, and command signal source 50 is synchronized with incoming AC power V3.

Command signal source 46 provides input signals to switch element controller 326 through a subtractor. Command signal source 46 drives input line 150 of the subtractor and command signal source 52 drives input line 152 of the subtractor. The subtractor may be comprised of an opto-isolator, photo transistor, photo diode, op amp or other suitable device to isolate the input on lines 150 and 152 from the output which drives buffers AD1 and AD2. Buffers AD1 and AD2 drive switching elements 300 and 302, respectively.

Command signal sources 46, 48 and 50 are synchronized with the incoming AC power for the phase the command signal source controls. Synchronization with the incoming AC power may be accomplished by Hall effect sensors such as Hall effect sensors S1, S2 and S3 as shown in FIG. 2(E) or Hall effect sensor S1 as shown in FIGS. 2(F) and 2(H).

Command signal source 52 is a triangle wave generator operating at a frequency of between 5 kHz and 25 kHz in one embodiment. A symmetrical wave form of between 8 kHz and 16 kHz is preferred. A frequency of 15 kHz has been employed in the embodiment shown in FIG. 1. Generally, the higher the frequency, the better the performance of the circuit. At higher frequencies, operation is more efficient because smaller increments of the voltage signal are used, because such components as are used to convert from AC to DC, such as filter 22, may be selected with more precision, and because there is a reduction in energy loss (except for non-semiconductor devices). The particular frequency selected depends on the characteristics of line filter 22.

Preferably, command signal sources 46, 48, and 50 produce sinusoidal signals and signal source 52 produces symmetrical triangle signals. The subtractor can be considered to be a analog to digital converter which switches to "high" state for positive error and the "low" state for negative error between the sine wave 46 and the triangle wave 52. This makes it easier for buffers AD1, AD2, AD3, AD4, AD5 and AD6 to detect a transition above, or below, a desired threshold level. The analog to digital converters may also be thought of as threshold detectors. Command signal source 52 may also be driven with a DC bias or offset level, causing the switching matrix 24 to draw more power from either the positive or negative portion of the cycle of the incoming AC power. Switch element controllers 328 and 330 operate in a manner similar to switch element controller 326, but are connected to command signal sources 48 and 50, respectively. However, this open loop operation has limited use because of the changing input supply and loads, hence it is preferred that a feedback loop be implemented.

Figure 2A:
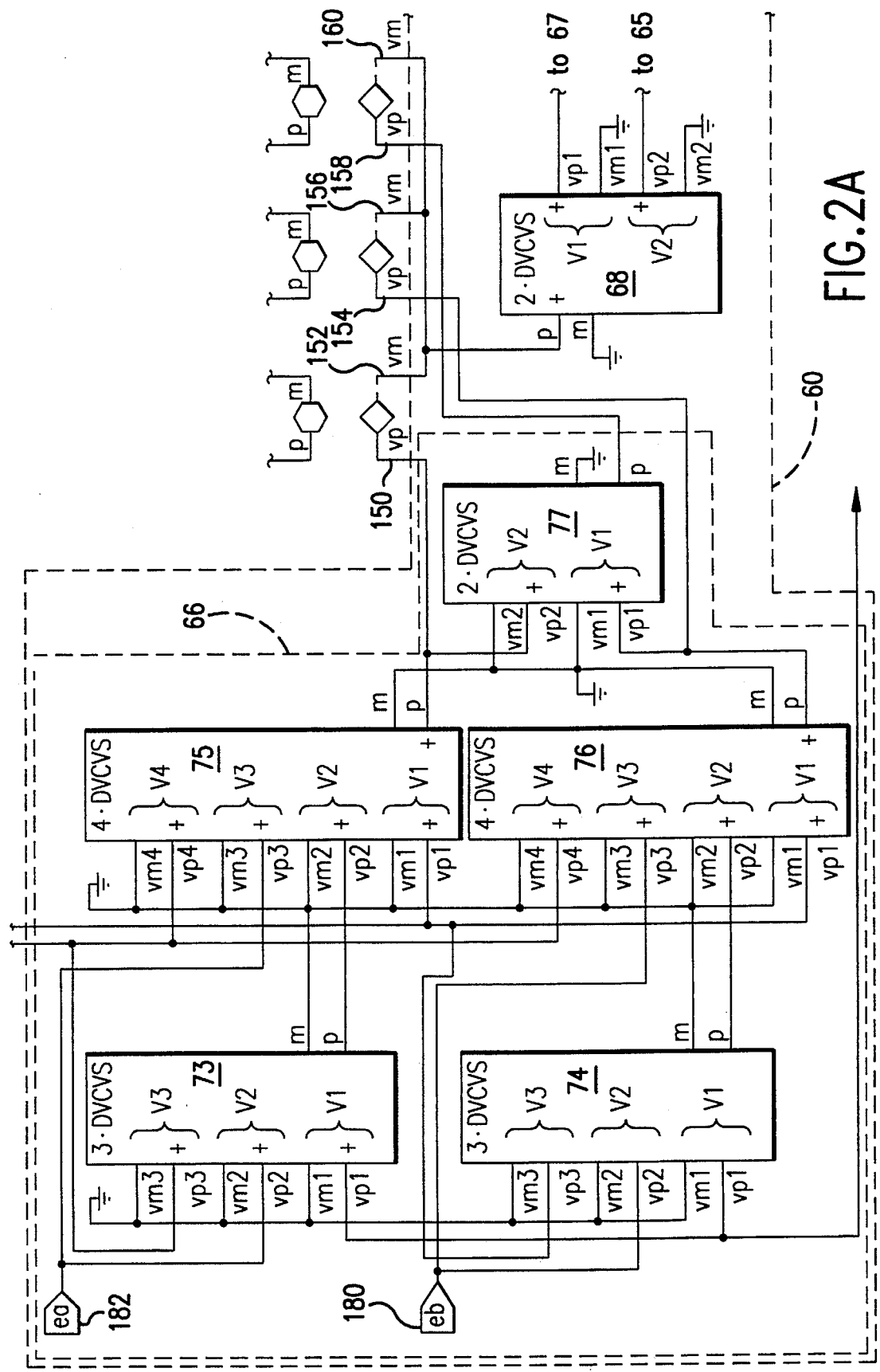
FIG. 2A is a schematic diagram of an embodiment of the present invention with a feedback loop.

One version of a feedback mode configuration is shown in FIGS. 2A and 2B. The DC signal output on lines 12 and 14 of FIG. 1 drives a feedback circuit 60 which replaces the individual command signal sources 46, 48 and 50 in FIG. 1. Feedback network 62 consists of a subtractor 61 which outputs the difference between the signal output on lines 12 and 14 and the signal supplied by reference voltage source 63. The output of feedback network 62 drives controller 64 which evaluates the phase of each of the incoming power lines V1, V2 and V3, and determines the appropriate increase or decrease in voltage which is required.

The output of controller 64 is routed through a level shifter 65. Level shifter 65 is preferably an op amp and provides a 12.5 V level shift. A reference voltage source 67 is multiplied by the level shifted output of controller 64 by multiplier 68. The output of multiplier 68 drives one terminal, preferably the negative input terminal 152, 156, and 160 of driver matrix (analog-to-digital converters) 70, 71, and 72, respectively.

A scale-down buffer and phase shifter 66 monitors the phase and voltage of the incoming signal presented by V1 and with respect to neutral, and selects the appropriate switching elements of switching matrix 24 in order to connect the incoming AC power V1, V2 or V3 to best maintain the desired DC output level across DC output pins 12 and 14. In the embodiment shown, one phase less than the number of incoming AC signal lines are monitored (180 and 182). Alternative embodiments may be implemented which monitor all of the incoming AC signal lines.

Scale-down buffer and phase shifter 66 is further comprised of a matrix of subtractor circuits 73, 74, 75, 76, and 77. Each of the subtractor circuits may be constructed using an operational amplifier with appropriate feedback. The operation of the subtractors is to sum the differential voltage applied to each of the inputs. For example, subtractor 73 has three sets of differential inputs, V1, V2 and V3. Each of the differential inputs has a plus and minus input leg, VP and VM, respectively. Subtractor 73 sums the inputs on VP1, VP2, and VP3, and subtracts the results from the sum of VM1, VM2, and VM3. Depending on the particular configuration of the operational amplifiers desired, the same result can be achieved by summing the differential voltage V1 with differential voltage V2, and differential voltage V3. The result is applied as a differential voltage output across the P and M terminals of subtractors 73.

Subtractor 74 is identical to subtractor 73. Subtractors 75 and 76 have an additional, fourth differential input voltage which is summed with differential inputs V1, V2, and V3. Similarly, subtractor 77 has only two inputs, V1 and V2. While most of the signal operations are performed on differential signals, for many of the signal inputs and outputs, there is a single driving line implementation, and the complementary component of the differential signal is ground. Care must be taken when grounding these inputs to ensure that fluctuations in the ground plane or noise propagating across the ground plane does not affect operation of the circuit.

Figure 2D:
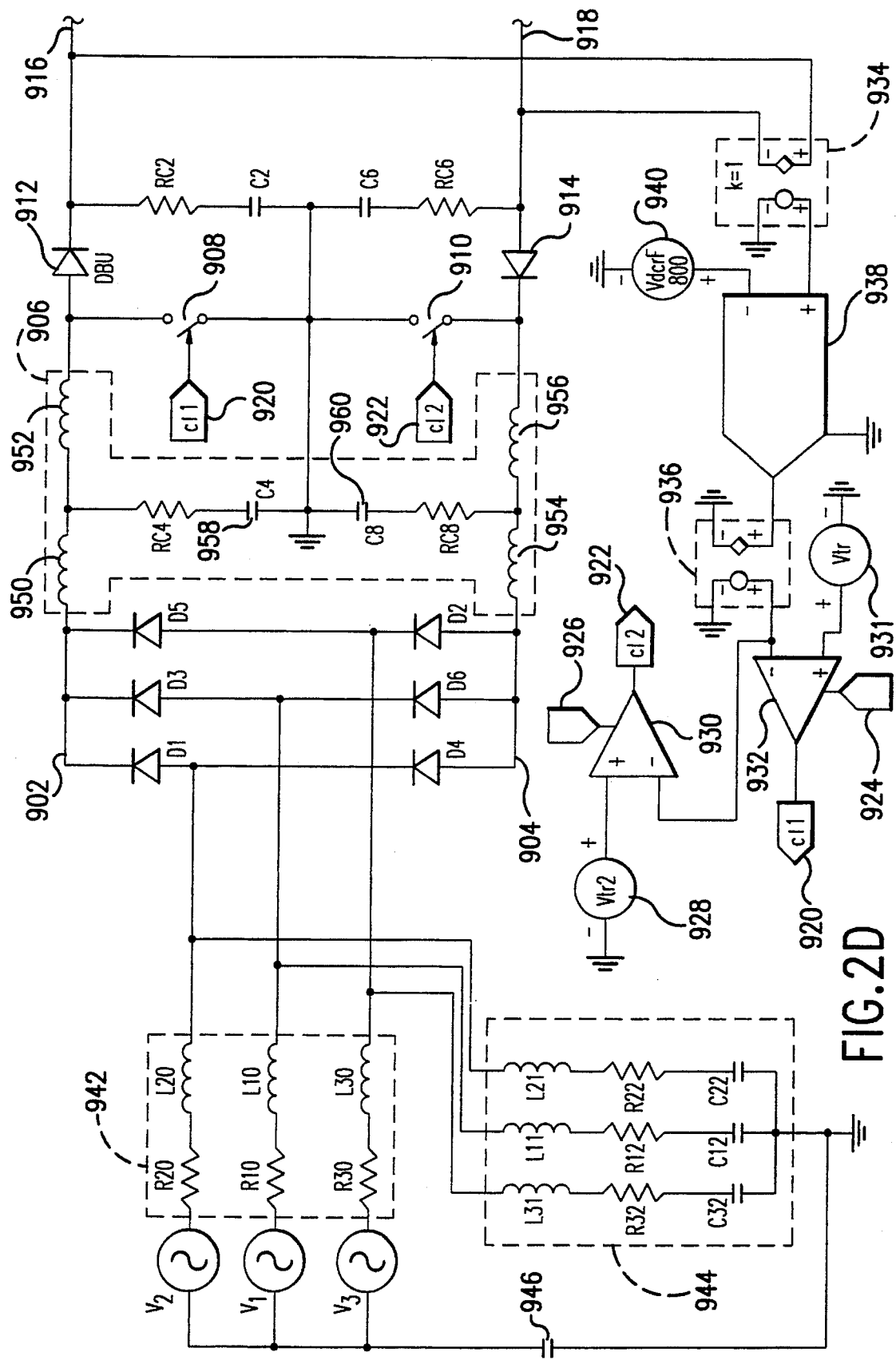
FIG. 2D is a schematic diagram of an embodiment of the present invention using a feedback loop.
Figure 2E:
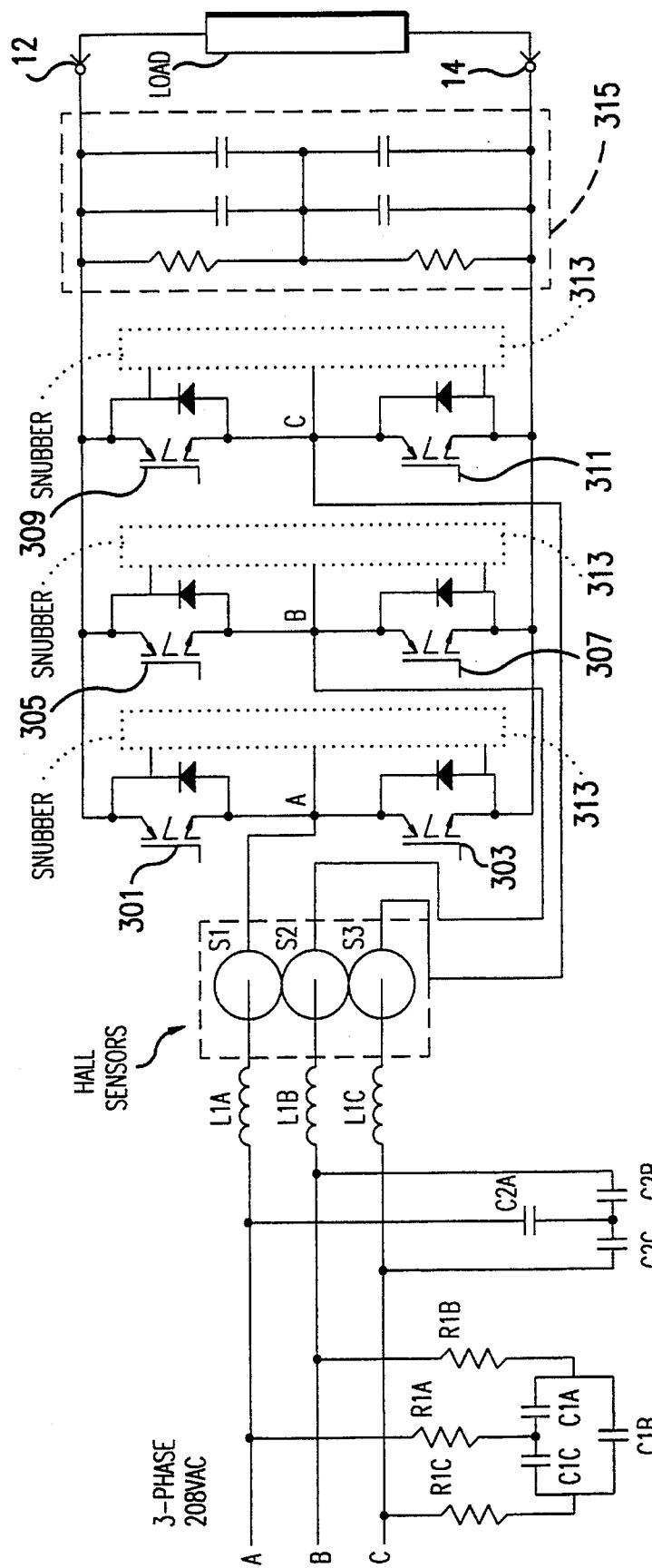
FIG. 2E shows an alternative embodiment of a three-phase AC to DC converter in which feedback is employed.
Figure 2F:
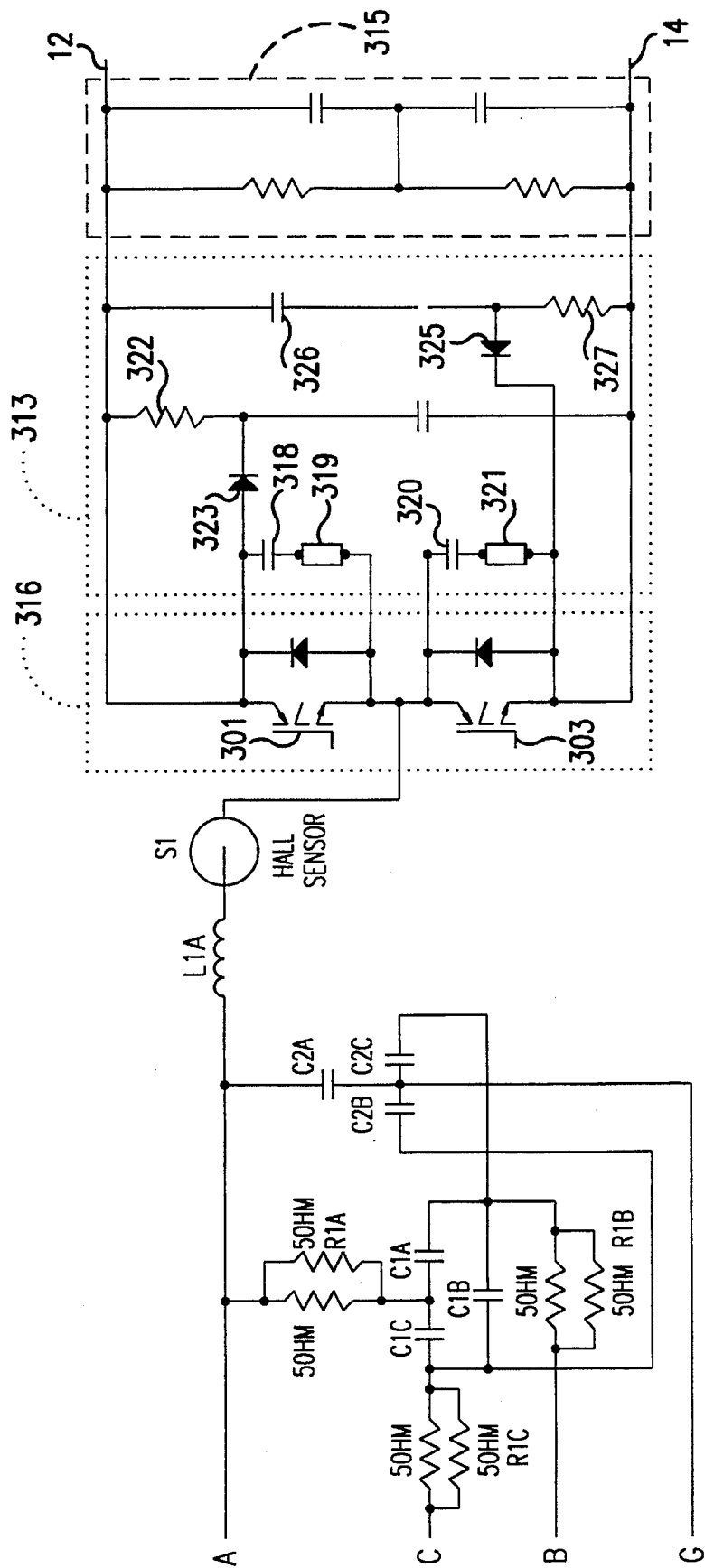
FIG. 2F shows the details of FIG. 2E.

Another embodiment of a feedback driven AC to DC conversion system is shown in FIG. 2(D). The configuration of the AC to DC power conversion system shown in FIG. 2(D) is also implemented for a 3-phase, AC input, represented by phases V1, V2 and V3. The incoming voltage phases are passed through a passive filter network shown in FIG. 1 as filter 22, comprised of series inductances L1, L2, L3, L4, L5 and L6 and capacitors C1, C2 and C3.

A modified passive filter 942 and 944 is employed in the configuration shown in FIG. 2(D). Passive filter 942 is comprised of resistors R10, R20 and R30 in series with inductors L10, L20 and L30, respectively. Passive filter 944 is comprised of inductors L11, L21, L31, resistors R12, R22, R32 and capacitors C12, C22 and C32, arranged as shown in FIG. 2(D).

The output of the passive filters 942 and 944 is directed into a full wave rectifier for each of the phases V1, V2 and V3. The full wave rectifier is formed by diodes D1, D2, D3, D4, D5 and D6. The output of the full wave rectifier is placed across lines 902 and 904 and is a floating or unreferenced, pulsed DC signal. This unreferenced, pulsed DC signal is then passed through a filter network 906 which smooths the wave form on lines 902 and 904.

Diodes 912 and 914 provide clamping to ensure that no back EMF or reverse voltage is driven into the system, and the DC output from filter 906 is placed across DC output lines 916 and 918. Two switching elements 908 and 910 are alternately activated to regulate the load seen by the output of the full wave rectifier diode array.

Output capacitors C2 and C6 are placed between output lines 916 and 918. Resistors RC2 and RC6 represent the internal resistive component of capacitors C2 and C6, respectively. The center tap of the series arrangement of capacitors C2 and C6 is connected to ground and to one pole of the switching elements.

Switching elements 908 and 910 are activated by control signals 920 and 922, respectively. Switching element 908 controls the storage of energy in inductor 952 and capacitor C2 in order to maintain a constant voltage output on line 916. Diode 912 prevents a back EMF from being generated by the overshoot of inductor 952, or the overshoot of capacitor C2. By alternately opening and closing switching element 908, the current through inductor 952 is momentarily increased.

Due to the inductive nature of inductor 952, the instantaneous voltage drop caused by grounding one side of inductor 952 will result in a gradual increase of the current through inductor 952. While this current increase is taking place, the power requirements or load present on line 916 is supplied by the energy stored in capacitor C2. When switching element 908 is deactivated, the high current which has begun to flow through inductor 952 will continue to flow in capacitor C2, charging capacitor C2.

While capacitor C2 is charging, the current through inductor 952 will gradually decrease, depending on the load applied across DC output lines 916 and 918. Part of this current charges capacitor C2. After capacitor C2 has become charged, the current through inductor 952 will decrease, based on the load applied to line 916.

Switching element 910 operates in a similar manner to switching element 908, but operates in conjunction with inductor 956, capacitor C6 and diode 914. By alternately storing and releasing energy from capacitors C2 and C6 and inductors 952 and 956, a stable voltage wave form can be output across lines 916 and 918 which will remain substantially unchanged during a steady state current draw.

One of the advantages of the embodiment shown in FIG. 2(D) occurs during dynamic loading and unloading of lines 916 and 918. By employing a high switching frequency driving switching elements 908 and 910, the amount of time required for the power supply to respond to an increased or decreased current demand is greatly reduced, and is typically on the order of 2–5 switching cycles. This results in an AC power supply which can respond extremely rapidly to dynamic changes in the DC load. Typical power supplies or AC to DC conversion systems require several cycles of the incoming AC signal, typically at 50 or 60 hertz in order to stabilize the DC output once load switching has occurred. By employing the techniques of this embodiment, the DC output across lines 916 and 918 is stabilized well within one cycle of the incoming AC signal.

The voltage across lines 916 and 918 drives an isolator 934 which may be an op amp or comparable device. Isolator 934 provides a proportional reduction of the voltage across lines 916 and 918, reducing the voltage of approximately 408 Volts DC to a voltage level which is more workable using conventional logic circuits, and standard operational amplifiers having an operating range between +24 Volts and −24 Volts. Care must be taken in employing a precision reduction network within isolator 934 to prevent errors induced by nonprecision resistors or components which drift over time or temperature.

The output of isolator 934 provides one input to a network controller 938. Network controller 938 compares the signal supplied by isolator 934 with a reference signal indicative of the DC voltage desired across lines 916 and 918. This reference source is identified as voltage reference source 940.

The output of network controller 938 is a transfer function of the different signal applied to the inputs of network controller 938 by isolator 934 and DC reference source 940. The output of network controller 938 drives isolator 936 which provides an input signal to two analog to digital converters 930 and 932. Analog to digital converters 930 and 932 independently compare the input signal triangle with two voltage levels 928 and 931, respectively, and drive switching elements 910 and 908, respectively.

The network controller 938 is preferably a dynamic function, and not strictly a DC reference voltage level. This function is defined as the following:

$$A(\text{output}) = a \times \frac{1 + \frac{s}{2\pi fz}}{1 + \frac{s}{2\pi fp}} \; ; \qquad \text{Eq. (1)}$$

$s = \omega i$ (complex frequency domain)

where $V_{tr}$ is a triangle wave of a fixed frequency, preferably between approximately 5 kHz and 25 kHz, depending on the desired efficiency of the AC to DC converter, and the particular components employed in the filter network. By increasing the frequency of the triangle wave, the values and size of the filter components can be reduced. The triangle wave may be synchronized with one of the incoming voltage sources, V1, V2, or V3, however, this is not required for operation of the circuit.

Analog to digital converters may be formed using comparators and threshold detectors. The analog to digital converters 930 and 932 incorporate an enable line which allows the switching elements to be disabled by external circuitry. The output of analog to digital converter 932 is enabled by enable line 924. When enable line 924 is inactive, comparator 932 will not activate line 920, and thus will not enable switching element 908. This results in switching element 908 remaining open, and the input to filter network 906 being transferred directly to the output of filter network 906.

Similarly, analog to digital converter 930 compares the output of 936 with a second voltage reference source 928. Enable line 926 controls activation of output 922 of analog to digital converter 930. Line 922 controls switching element 910 and when enable line 926 is deactivated, switching element 910 remains open.

The frequency of the triangle wave determines the values of inductors 952 and 956, and capacitors C2 and C6. For a frequency of 8 kHz, inductors 952 and 956 have a value of 100 µH and C2 and C6 are 12000 µF. Parasitic resistances RC2 and RC6 are 12 m Ohms.

$V_{dc}$ is the DC signal desired across lines 916 and 918, and proportionally driven by DC reference voltage source 940.

Switching network controller 938 has a phase relationship, $\omega_z$, equal to $2\pi f_z$. The phase relationship $\omega_z$ may be determined by the following equations where:
D=Pulse ratio of the boost invertor
D'=(1−D)
and the transfer function Gc(S) of the sine Pulse Width Modulation converter (AC/DC converter 512) is $$G_c(s) = \frac{V_o(s)}{D(s)} = Aco * Gfo * \frac{\left(1 - \frac{s}{\omega_a}\right)\left(1 + \frac{s}{\omega_z}\right)}{1 + 2d\left(\frac{s}{\omega_o}\right) + \left(\frac{s}{\omega_o}\right)^2} \quad \text{(Eq. 2)}$$

$$\omega_a = \frac{(D')^2 R + R_L}{L} \quad \text{Eq. (3)}$$

$$\omega_o = \sqrt{\frac{(D')^2 R + R_L}{(C*L)(R + R_c)}} \quad \text{Eq. (4)}$$

the natural frequency of the given circuit.

$$\omega_z = \frac{1}{C*RC} \quad \text{Eq. (5)}$$

the frequency of the zero in the transfer function.

$$2d = \omega_o \left( C*R_c + \frac{C*R*R_L + L}{(D')^2 * R + R_L} \right) \quad \text{Eq. (6)}$$

$$Gfo = \frac{R}{R + \left[\frac{R_L}{(D')^2}\right]} \quad \text{Eq. (7)}$$

the gain factor of the transfer function.

$$Aco = \left[ \frac{(D')^2 R - R_L}{(D')^2 R + R_L} \right] * \frac{\hat{e}}{(D')^2} \quad \text{Eq. (8)}$$

gain factor, where ê=peak value of the input voltage.

The zeros of $G_c(s)$ are $\omega_a$ and $\omega_z$ which should be canceled by the pole-pair $\omega_p$ of the feedback network of the block 64 of FIG. 2B.

$$\omega_p = \frac{(\omega_a + \omega_z)}{2} \quad ; f_p = \frac{\omega_p}{2\pi} \quad ; \quad \text{Eq. (9)}$$

$$d = 0.7;$$

the damping factor of the feedback circuit.

The controller of the block 64 in FIG. 2B can be of the proportional-integral (PI) type or the integral (I) type. The transfer functions of the feedback network and the controller of the block 64 in FIG. 2B become (in generalized terms):

$$G_{64-1}(s) = \frac{a}{(1 + b \cdot s + c \cdot s^2)} \quad ; \text{and } G_{64-2}(s) = \frac{1}{s} \quad \text{Eq. (10)}$$

The constants a, b, c are converter design specific and depend on output circuit parameters and stability criteria.

The output of switching network controller 938 is compared with the triangle wave to generate an error signal, or difference signal, in comparator 932 and comparator 930.

The second reference voltage source 928 is preferably the inverted signal present as triangle reference voltage 931.

The diode matrix D1, D2, D3, D4, D5 and D6 is optimized with inductors 950 and 954, and capacitors 958 and 960. Resistors RC4 and RC8 represent the inherent resistance of capacitors C4 and C8, respectively. These inherent resistances must be taken into account when calculating the performance of the rectifier network and the filter network.

A series inductance network 942 is placed in line with each of the incoming voltage phases. In FIG. 2D, inductor L10 is in series with voltage source V1, inductor L20 in series with voltage source V2 and inductor L30 in series with voltage source V3. Resistors R10, R20 and R30 are the inherent resistances of inductors L10, L20 and L30, respectively, and are shown to illustrate the small circuit model of the inductors of the embodiment of FIG. 2D. In one embodiment, inductors L10, L20 and L30 are each 187 microHenries (µH) and resistances R10, R20 and R30 are 10 mΩ each.

Similarly, parallel LC circuit network 944 is attached to each of the incoming voltage phases once they have passed through filter network 942. Preferably each of these parallel LC loading networks is comprised of an inductor in series with a capacitor, such as L11 and C12, L21 and C22, and L31 and C32. Resistors R12, R22, and R32 indicate the resistance loss of the capacitors and inductors, and are shown to illustrate the small circuit model of the inductor and capacitor network. Preferably, inductors L11, L21 and L31 are 1.44 mH, and capacitors C12, C22 and C32 are 281 µF. Resistances R12, R22 and R32 are 0.001 Ohms.

The feedback circuit as shown in FIGS. 2A–2D provides the advantage of enabling the network to drive a lower DC voltage, and accommodate switching of large amounts of current across the DC output without dropping the DC voltage output across pins 12 and 14 excessively for a long period of time. Feedback network 60 ensures that the desired DC voltage level is maintained for a wide range of current outputs, and during current switching.

Referring to FIG. 2B, the feedback network 60 includes a scale down buffer and phase shifter 66. The scale down buffer and phase shifter 66 consists of several op amps configured as subtractors and summers in one embodiment. Additional circuitry in controller 64 implement the hardware solution of the equations shown below. It is recognized that these equations may be solved by a microprocessor driven system, but dedicated hardware devices may also be employed in order to reduce the complexity of the system, eliminating the need for generating complex microcode to solve the equations and enabling the system to operate at higher speeds. While the higher speeds which are achieved through a hardware implementation of this section of the feedback loop is not overwhelming when controlling drivers of an input wave form which operates at 50 or 60 Hz, as the source frequency is increased to 400 Hz or 50 kHz to 100 kHz, the speed advantage of the hardware implementation may become noticeable.

Controller 64 also includes a pair of devices which establish a relationship between the sensed voltage, AC input power, and activation of switching elements 300, 302, 304, 306, 308 and 310 through a hardware implementation.

It is recognized that controller 64 could also be implemented through a microprocessor or other computing device to achieve a similar result. The hardware implementation has been selected because it is more streamlined, faster during operation, faster to implement, and occupies less space than a microprocessor of the required complexity to perform similar functions.

For the circuit shown in FIG. 1, the line inductance L1, L2 and L3 are each 700 μH and the line resistance R1, R2 and R3 are each 50 mΩ. The incoming voltage of each of the phases V1, V2 and V3 is presumed to be 120 Volts, and the pulse frequency or switching speed of the switching elements 300, 302, 304, 306, 308 and 310 is 15.12 kHz.

Figure 3:
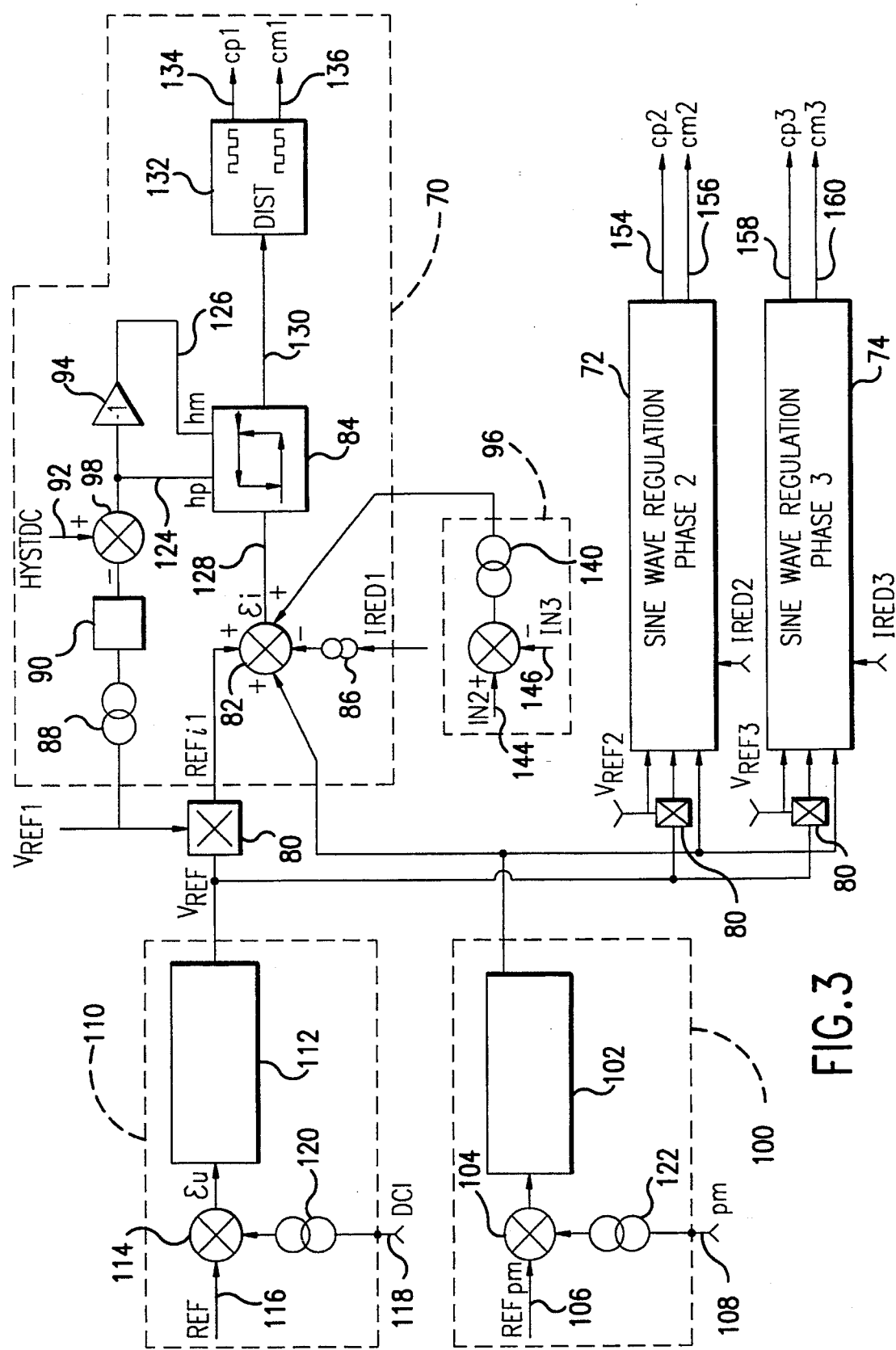
FIG. 3 is a block diagram of an embodiment of a hysteresis mode feedback loop.
Figure 5:
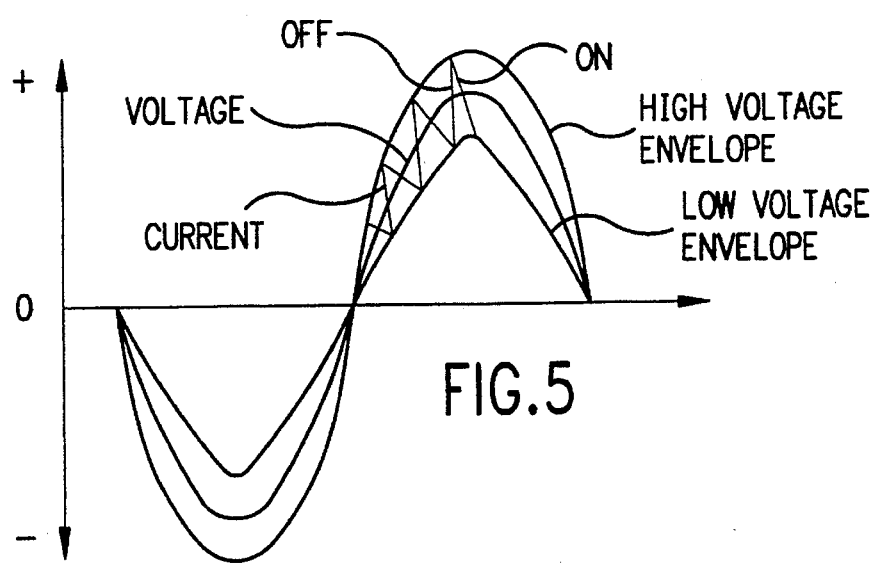
FIG. 5 shows the voltage envelope of the input waveform during operation of a hysteresis mode feedback loop.

A hysteresis mode control circuit which may be used in place of feedback network 60 to control switching elements 24 is shown in FIG. 3. Referring to the graph of FIG. 5, a hysteresis mode embodiment of the present invention switches a current load within a voltage envelope established by the high voltage envelope and a lower voltage envelope. The middle voltage signal represents a nominal voltage. When the current is off, the voltage level will rise to the parameter shown by the high voltage envelope. When the current load is switched on, the voltage level drops to the level shown by the low voltage envelope.

The open loop, constant frequency embodiment shown in FIG. 1 preferably switches at a constant 8 kHz rate. The configuration limits the ability to control the high voltage envelope and low voltage envelope. By employing the hysteresis mode active feedback network such as that shown in FIG. 3, the length of time that each phase is enabled is not set at a constant rate, but depends on the particular load and voltage level of each of the incoming AC signal phases of the power source. Using the hysteresis mode feedback circuit, the high voltage envelope and the low voltage envelope can be pre-determined, and the amount of time that each phase is loaded will be varied by the feedback circuit to accommodate the load applied to DC lines 12 and 14. The feedback circuit of FIG. 3 replaces feedback circuit 60 of FIGS. 2A and 2B for closed loop hysteresis mode operation.

Regulation for each of the phases is handled by a separate portion of the circuit shown in FIG. 3. Regulation of incoming AC signal V1 is accomplished by block 70, regulation of AC signal V2 is accomplished by block 72, and regulation of incoming AC signal V3 is accomplished by block 74. Blocks 70, 72 and 74 are identical, except that they each deal with a different incoming AC signal and have a reference signal associated with that phase as a unique input. For these reasons, the circuitry in regulator 70 will be explained in detail, and the regulators 72 and 74, will not be individually discussed.

Sine wave regulator 70 is made up of several discrete components. A multiplier 80 multiples the reference signal $V_{ref}$ supplied by the particular phase which is regulated. In the case of sine wave regulator 70, the reference voltage $V_{ref1}$ will be supplied by phase one (V1) of the incoming AC signal. This signal is multiplied by the reference voltage which is sensed through comparitor 62, process by controller 64 and multiplier 68. This signal is then summed in adder 82 with a correction signal which is generated by DC voltage balance correction circuit 100. This correction is to master a balance voltage on each output to ground.

Another input to adder 82 is an input capacitor current compensation factor generated by capacitor current compensation circuitry 96. Subtracted from these three signals is the current of the phase one adjusted by factor 86. This current is generated by the particular phase which is being controlled. The current phase representation 86 is representative of phase one.

Figure 3A:
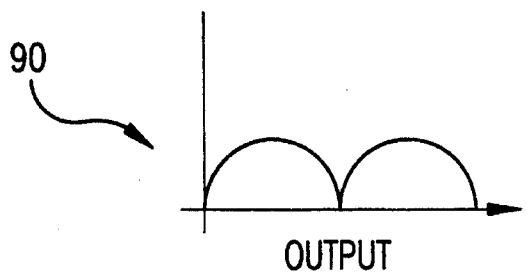
FIGS. 3A, 3B, and 3C shows the voltage waveforms outputs from various components as detailed in the block diagram of FIG. 3.
Figure 3B:
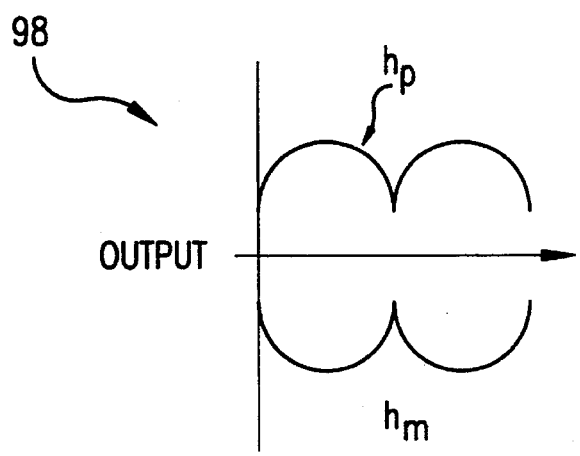
Figure 3C:
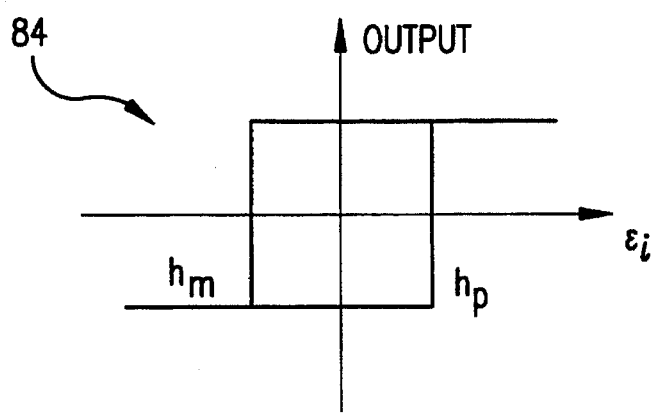

The reference voltage signal which drives multiplier 80 also drives voltage phase circuitry 88. The input of the voltage phase circuit is scaled down with 88. Circuit 90 is a rectifier bridge in the illustrated embodiment: Variable hysteresis is created during each cycle of AC input with summer 98 and inverter 94. The output of adder 82 represents the current phase and drives hysteresis circuit 84 through line 128. The output of hysteresis circuit 84 is a square wave switching signal 130 which drives a distribution matrix 132. Distribution matrix 132 provides a buffered signal 134 and an inverted signal 136 which are placed on lines 250 and 252, respectively, replacing the supply signal reference 46 and reference voltage 52. FIGS. 3A, 3B, and 3C illustrate the output voltage waveforms of the rectifier bridge 90, the summer 98, and the hysteresis circuit 84.

Similarly, the output of sine wave regulator 72 is placed on lines 254 and 256. Sine wave regulator circuit 74 similarly drives lines 258 and 260.

The hysteresis mode feedback circuit shown in FIG. 3 also preferably includes a neutral regulation circuit 100 which provides a voltage correction to adder 82 of sine wave regulator 70, as well as additional sine wave regulators 72 and 74 in a three-phase power supply arrangement. Neutral regulation circuit 100 includes a scale down buffer (122) on middle point voltage (108) and a reference voltage 106. The middle point voltage is subtracted from reference voltage in a summer 104 Then the signal is processed in network 102. It is recognized that a microprocessor may be employed, however, a hardware implementation is preferred in order to minimize the part count, increase the speed of operation, reduce the complexity and the design time required to implement the circuit employed with the present invention.

The hysteresis mode feedback loop of FIG. 3 includes an output regulation circuit 110 which supplies a reference voltage to each of the sine wave regulation circuits 70, 72 and 74. Before this reference voltage is multiplied by the particular phase reference voltage in multiplier 80. Output regulation circuitry 110 incorporates a scale down buffer 120 which is driven by the DC output voltage 118. The DC output voltage is subtracted from a reference signal 116 in summer 114. The output of summer 114 is processed through network 112 which implements the scaling function using dedicated hardware. It is recognized that this equation could also be implemented using a microprocessor and software or firmware to perform these manipulations, however, the circuit has been implemented using dedicated hardware in order to reduce the processing time and the complexity by eliminating the need for additional firmware or software development.

An alternative embodiment of a three-phase AC to DC power converter is shown in 2(E). The embodiment of FIG. 2(E) employs a reactive load implemented by capacitors C1A, C1B, C1C and C2A, C2B and C2C, as well as an inductive load indicated by inductors L1A, L1B and L1C. Each of the reactances and inductances correspond to one of the incoming phases, phase A, phase B and phase C. The designation such as "C" after the capacitor or inductor identifier indicates the incoming phase that the capacitor or inductor is electrically connected to.

Figure 2G:
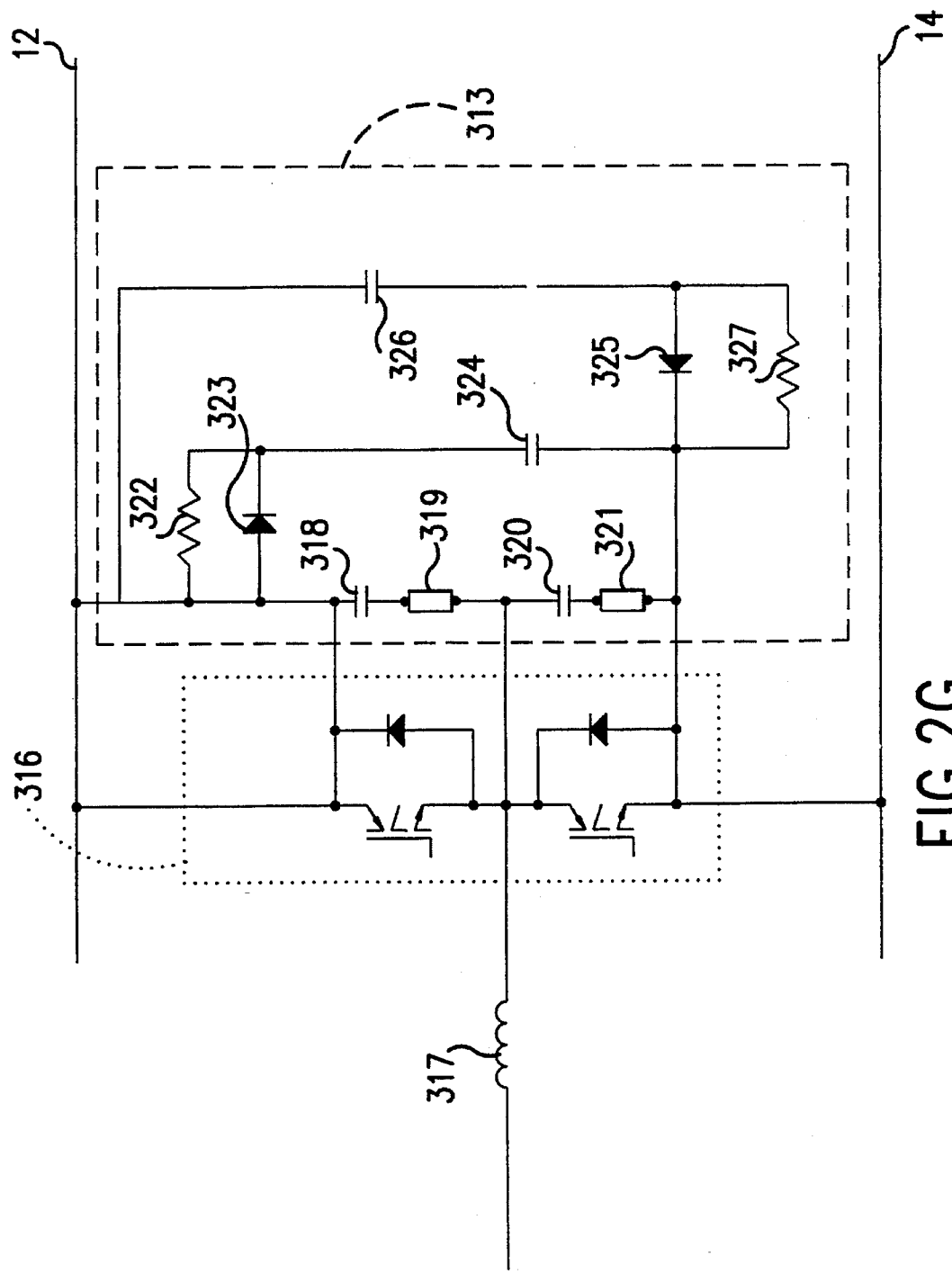
FIG. 2G converter is a schematic diagram showing the snubber circuit as employed in FIG. 2E.
Figure 2H:
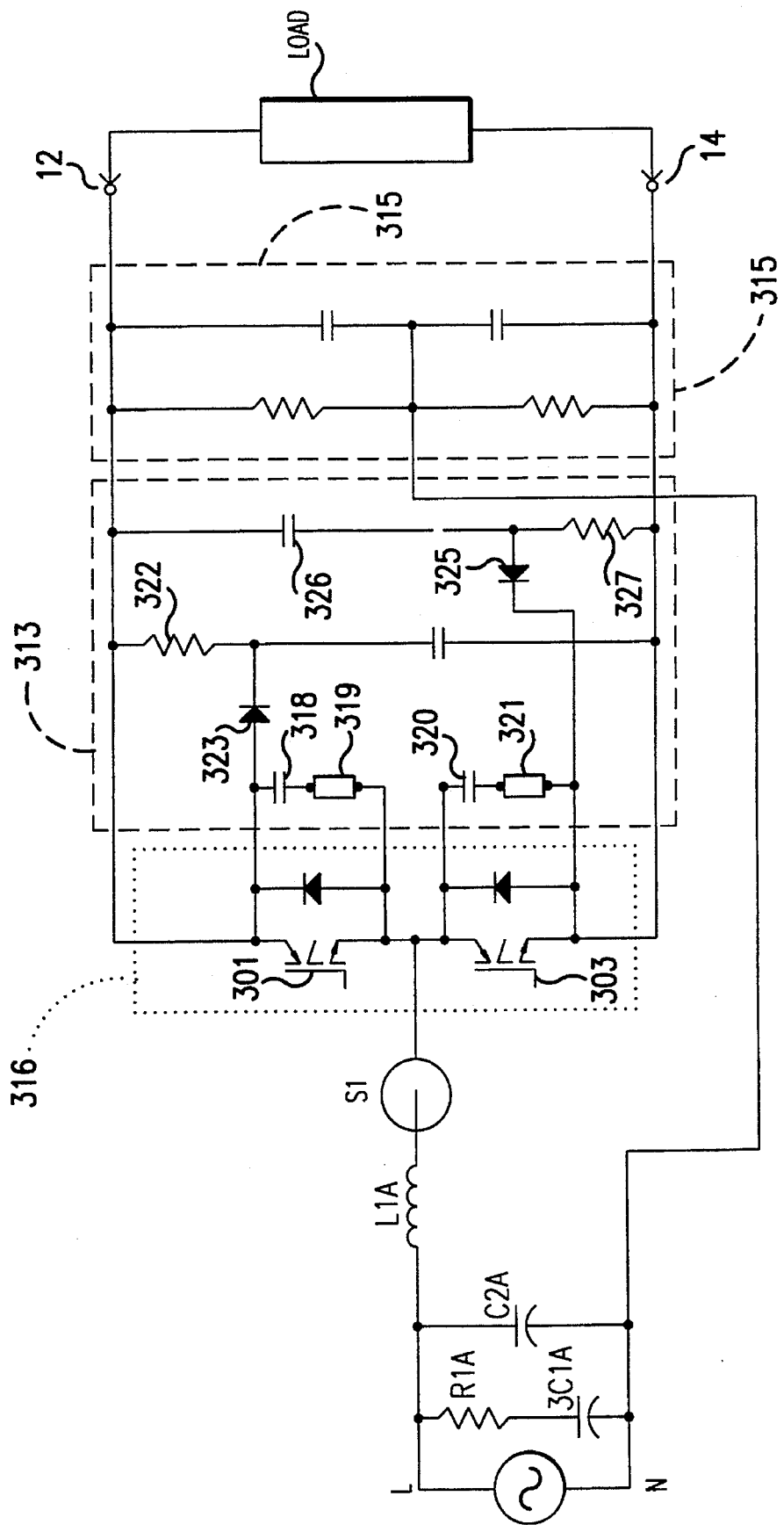
FIG. 2H shows a single phase equivalent of the 3 phase AC to DC converter in which feedback is employed (shown in FIG. 2E).
Figure 2:
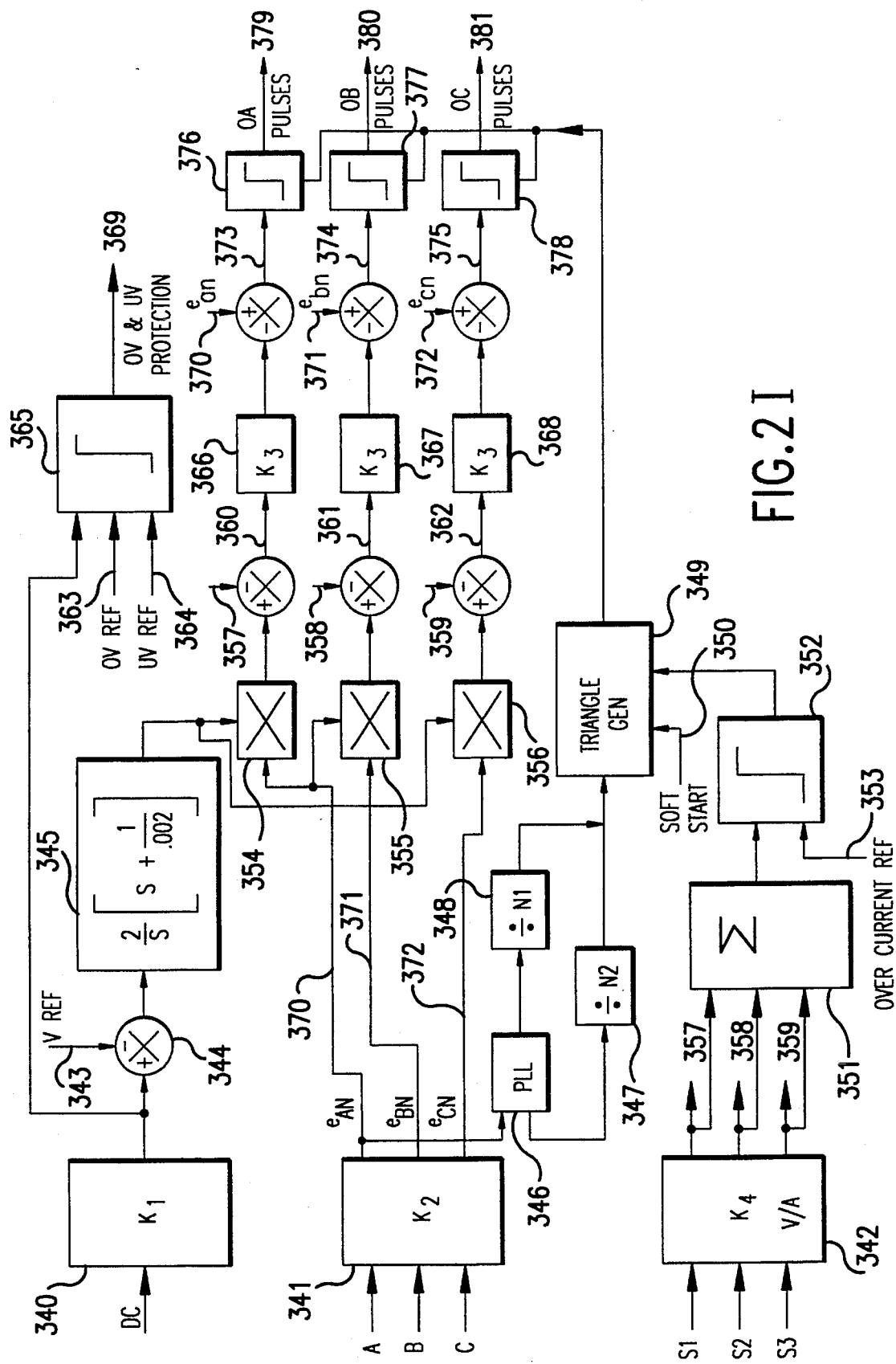
FIG. 2B is a schematic diagram of an embodiment of a feedback loop which may be used with the power conversion system.
FIG. 2C is a schematic diagram of an embodiment of a switching element of FIG. 1.
FIG. 2I is a block diagram showing the control concept for AC to DC converter of FIG. 2E.
FIG. 2J further illustrates the detailed circuit of FIG. 2I.
Figure 2J:
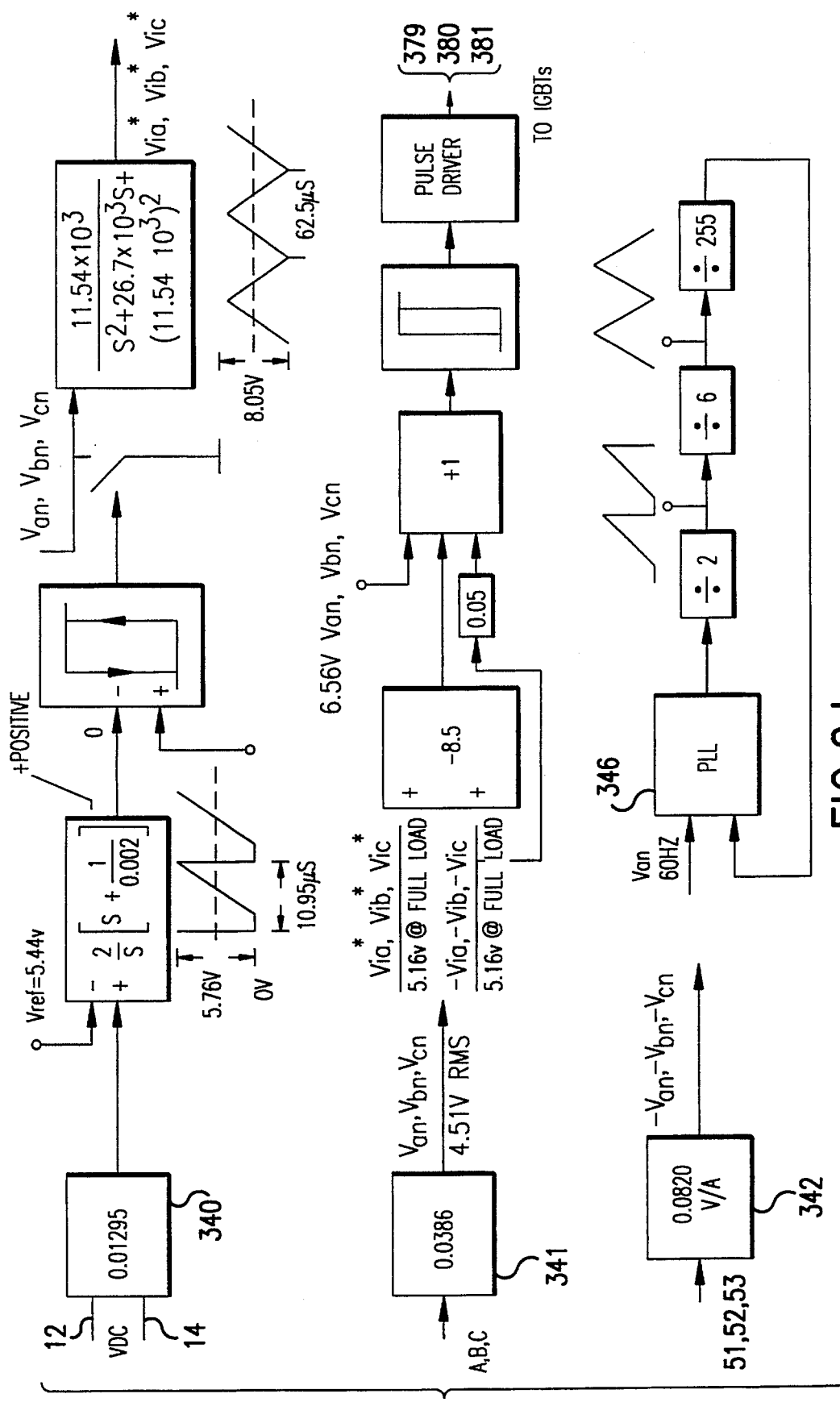

The AC to DC converter of FIG. 2(E) operates in a manner similar to the AC to DC converter of FIG. 1 with the feedback loop shown in FIGS. 2A and 2B. Switching elements 301, 303, 305, 307, 309 and 311 take the place of switching elements 300, 302, 304, 306, 308 and 310 as shown in FIG. 1. A snubber network 313 is connected across the switching elements in the embodiment of FIG. 2(E). A more detailed illustration of this embodiment is shown in FIG. 2(G). Filter network 315 of FIG. 2(E) filters out the high frequency components of the DC signal generated by the switching elements in order to place a DC signal across lines 12 and 14, which then may be connected to a load, as shown. In the embodiment shown, the DC voltage is approximately 400 Volts DC.

Referring to FIG. 2(G), the switching element matrix 316 is a dual IGBT module rated at a minimum of 75 Amps, 1200 Volts may be employed. The IGBT module 316 in FIG. 2(G) may be used as switching elements 301 and 303, 305 and 307, or 309 and 311 in the circuit shown in FIG. 2(E). Switching element network 316 may also be used in place of switching elements 300 and 302, 304 and 306, or 308 and 310. It is recognized that individual switching elements may be preferred in certain applications where a dual IGBT module may be inappropriate.

Another advantage of the dual IGBT module is that overvoltage protection diodes which are shown as part of dual IGBT module 316 in FIG. 2(G) are built into the IGBT module, and do not have to be added as separate elements. Similar overvoltage protection diodes are shown in association with switching elements 301, 303, 305, 307, 309 and 311 in FIG. 2(E). While these overvoltage protection diodes are not shown in FIG. 1 or FIG. 2(A), it is recognized that overvoltage protection diodes are preferred when operating an electronic switching element such as switching elements 300, 302, 304, 306, 308 and 310. Incorporating overvoltage diodes will prevent premature burn out or failure of the switching elements.

Inductor 317 shown in FIG. 2(G) is representative of inductors L1A, L1B, L1C, L1, L2 and L3 as shown in FIGS. 2(E) and 2(A), respectively. The snubber circuit 316 is preferably comprised of capacitors 318 and 320 which are each 0.022 µF in conjunction with amorphous beads 319 and 321 which act as inductors in the configuration shown, and preferably have one winding around a small ferrous bead. The exact number of windings and inductance of amorphous beads 319 and 321 depends on the layout and configuration of the switching elements as well as the layout and placement of the snubber network itself. Amorphous beads 319 and 321 are used to tune the remainder of the snubber circuit.

Diodes 323 and 325 incorporated into the snubber circuit 316 are preferably well known diodes which provide fast switching times in order to achieve overvoltage protection from high frequency transients. Capacitors 324 and 326 operate in conjunction with diodes 323 and 325 to ensure that only high frequency transients are eliminated by the diodes. In the embodiment shown in FIG. 2(G), capacitors 324 and 326 are each 0.22 µF capacitors. Resistor 322 is a 10 Ohm, 25 watt resistor in the embodiment shown in FIG. 2(G), and provides a discharge path over voltage in 324.

An additional snubber network is connected to the incoming AC phases A, B, and C. Resistors R1A, R1B and R1C in combination with capacitors C1A, C1B and C1C provide an input snubber network in the embodiment shown in FIG. 2(E). Capacitors C2A, C2B and C2C provide a high frequency filter. In one embodiment, capacitors C2A, C2B and C2C each have a value of 2.2 µF, and capacitors C1A, C1B and C1C have a value of 7.5 µF. Resistors R1A, R1B and R1C are formed by placing two 5 ohm resistors in parallel. The two resistors are placed in parallel in order to reduce the power dissipated by each of the resistor components. The snubber circuit shown in FIG. 2(F) illustrates the two resistor elements connected in parallel.

FIG. 2(F) illustrates an embodiment of the power conversion circuit employed in conjunction with three AC input phases A, B and C, and a ground line G. The snubber circuit employed in the embodiment shown in FIG. 2(F) is identical to the snubber circuit as shown in FIG. 2(E), and is comprised of resistors R1A, R1B and R1C and capacitors C1A, C1B and C1C. The high frequency filter network composed of capacitors C2A, C2B and C2C is similar to the configuration in the embodiment shown in FIG. 2(E), however, the point at which all three capacitors are joined together is electrically connected to the incoming neutral or ground line, connecting the incoming neutral or ground to the "defined" ground established at the junction of the incoming phases.

In the embodiment shown in FIG. 2(F), only one of the three incoming phases, phase A, is illustrated. The remaining phases are identical, and are electrically connected across lines 12 and 14. It is significant to note that filter network 315 is not repeated for each of the pairs of switching elements.

The snubber circuit 313 illustrated in FIG. 2(G) is identical to the snubber circuit shown in FIG. 2(F), and more clearly illustrates the location and configuration of the snubber circuit 313 with respect to the switching elements and high frequency filter network.

The embodiments shown in FIGS. 2(E) and 2(F) can be readily modified for single phase operation. An example of this modification is shown in FIG. 2(H) in which an incoming AC signal is input across line L and neutral N. A snubber network is formed by R1A and C1A. High frequency filtering is accomplished by C2A. A series inductor L1A is placed between the snubber and filter components and the switching elements.

A Hall sensor S1 may be employed to monitor the current drawn by the switching elements. A single switching element network 316 contains switching elements 301 and 303. Snubber network 313 is identical to the snubber networks employed in FIGS. 2(E), 2(F) and 2(G). Filter network 315 is a classical RC filter network to smooth the DC output which is then presented across lines 12 and 14.

The only difference between 2(H) and 2(E) and 2(F) is the ripple voltage that is produced on line DC Bus (between 12 and 14). In case of FIGS. 2(E) and 2(F), the ripple frequency is 6 lines' input frequencey (360 Hz for 60 Hz input) while in 2(H) it will be 60 Hz. Consequently, for the same power rating, bigger DC capacitors need to be used to filter out the ripple in voltage/current. FIG. 2(H) is used for low power systems where single phase power is adequate. FIGS. 2(E) and 2(F) are used with high power systems where 3 phase power is needed to distribute line loading evenly to all three phases. Both systems in FIGS. 2(E) and 2(F), and 2(H) can generate any DC voltage larger than line peak-to-peak value of line incoming sine wave.

In this embodiment shown in FIGS. 2(E), 2(F) and 2(H), the switching elements are preferably operated in a fixed frequency mode at a preferred switching frequency of 15.35 kHz. The higher frequency is also possible with faster devices and different switching techniques. The high frequency filter elements, C2A, C2B and C2C are selected to filter out the switching transients which may be fed back through inductors L1A, L1B and L1C to the input voltage phases A, B and C.

The embodiments of FIGS. 2(E), 2(F) and 2(H) may also be operated by a feedback driven control circuit such as is shown in FIGS. 2(A), 2(B), 2(I) or 2(J). The DC output across lines 12 and 14 is proportionally reduced by a resistor divider network or op amp 340. In the embodiment shown in FIG. 2(I), a single DC input line represents the voltage across lines 12 and 14. The complimentary input is presumed to be ground. In the embodiment shown in FIG. 2(J), a differential input to the resistor divider network is employed. A constant multiplier, such as 0.01295, is used to reduce the 400 Volt DC input to a voltage level which can be more readily employed to control the switching elements.

The incoming AC phases A, B and C are also monitored and are reduced by a similar voltage divider or op amp network 341 to a working voltage level, maintaining the phase integrity of the incoming AC signals. A multiplier in the embodiment shown in FIG. 2(J) of 0.0386 reduces the incoming AC signal to approximately 4.51 Volts AC.

Hall sensors S1, S2 and S3 are buffered and amplified by op amps or other compatible circuitry in buffer 342. In the embodiment of FIG. 2(I), the hall sensors provide an output of 80 millivolts per amp of current drawn by the incoming AC phase which is being sensed. In the embodiment shown in FIG. 2(J), a voltage of 82 millivolts per amp sensed is generated. Many Hall sensors have a predetermined output voltage ratio which may be multiplied up or down in order to achieve the desired voltage to current ratio. Hall sensors may provide an output of 50 millivolts per amp of current sensed. These hall sensors must be multiplied by a factor greater than 1 in order to achieve the 80 or 82 millivolts per amp sensed which is employed in the embodiments of FIGS. 2(I) and 2(J), respectively.

It is recognized that a variety of different Hall sensor voltages, as well as incoming AC signal voltages and DC signal levels may be employed in conjunction with a variety of modifications of the remainder of the circuitry to accommodate the changed voltage levels. The operation of the control circuit embodiments of FIGS. 2(I) and 2(J) has been established in an attempt to optimize the sensitivity of the control circuit to small changes in voltage or current, yet employ a relatively inexpensive circuit using low voltage operating components.

Overvoltage protection and under voltage protection is incorporated into the embodiment of FIG. 2(I) by monitoring the DC output across lines 12 and 14. An overvoltage comparison network compares the output of voltage divider 340 with an overvoltage reference signal 363. Similarly, an under voltage protection circuit compares the output of voltage divider network 340 with an under voltage reference signal 363. Both the overvoltage and under voltage comparison networks are incorporated into overvoltage and under voltage protection block 365 which generates an under voltage or overvoltage indicator signal output on lines 369.

The output of voltage divider 340 is also compared with a reference voltage 343, creating an error signal indicative of the difference between the DC output voltage across lines 12 and 14 and a desired DC output reference voltage. This may be accomplished by an op amp or other suitable device 344.

The error signal drives a high gain proportionally integral amplifier 345. The high gain proportional integral amplifier 345 may be formed of a suitable op amp combination or other comparable circuitry. The output of the high gain proportional integral amplifier is representative of a current reference signal. This current reference signal is used as a multiplying factor for each of the incoming phases. This multiplication is performed by multiplier 354, 355 and 356. Each of these multipliers may be an op amp or suitable, comparable device or circuit. The result of the multiplication of each of the incoming AC phases by the current reference is a current reference signal which is in phase with each of the respective phases.

This current reference signal represents the threshold set for current supplied from each of the phases on a continuous basis. The current supplied from each of the phases is then compared with the current being drawn by each of the phases, as detected through the hall sensors S1, S2 and S3.

For incoming phase A, the output of voltage divider network 341 provides an input signal to multiplier 354. The other input to multiplier 354 is provided by the high gain proportional integral amplifier 345. The output of multiplier 345 is compared with the proportionally adjusted voltage detected by hall sensor S1 and multiplied by buffer 342 and output on line 357.

An error signal indicating the difference between the current reference output by multiplier 354 and the current feedback provided by line 357 is generated by a differential comparator circuit 360. Differential comparator 360 may be an op amp or other comparable device.

The output of the differential comparator 360 is multiplied by a constant 366 in order to generate a signal having an appropriate voltage level. This signal is then further compared with the output of voltage divider 341 corresponding to incoming signal phase A by differential comparator 373. Differential comparitor 373 may be an op amp or other suitable device. The output of differential comparitor 373 indicates when each of the switching elements may be activated, and provides an input to driver 376. Driver 376 incorporates a level shifter which converts the analog signal output by differential comparitor 373 into digital pulse which are placed on control lines 379 and are used to control the drivers for switching elements 301 and 303.

Level shifter 376 supplies a high frequency switching signal which is combined with the output of differential comparitor 373 by an adder or multiplier. This signal is then compared to a threshold circuit which determines activation of the switching elements based on the overall magnitude of the combined high frequency switching signal and the output of differential comparitor 373. The voltage level which causes triggering of the threshold circuit is determined by the differential comparitor 373, as well as whether these two signals are added or multiplied. Multiplication is referred as the amplitude swings, and rate of change are greater.

The high frequency switching signal is synchronized with the incoming voltage phase by triangle generator 349. A triangle signal is preferred as a high frequency switching signal over a sinusoidal signal because the rate of change of the triangle signal is constant, whereas the sinusoidal signal enjoys a greater rate of change during zero crossings than it does during the peak of the AC signal.

Triangle generator 349 has in input which is derived from one of the incoming AC phases, preferably phase A as indicated in the embodiment shown in FIG. 2(I). The output of voltage divider 341 which is representative of incoming phase A drives a phase lock loop 346 which in turn drives dividers 347 and 348. The output of dividers 347 and 348 is recombined to generate a triangle wave, or triangle signal. This signal is buffered through triangle generator 349 which combines certain other features. Anchoring or locking the phase of the triangle generator to coincide with the phase of one of the incoming AC signals, or phases, ensures that the triangle signal will not "walk" or "travel" but will remain stable, synchronized with the particular incoming AC phase selected.

Triangle generator 349 generates a triangle wave having a predetermined peak voltage. In one embodiment shown in FIG. 4(J), this voltage is 8.05 Volts AC. In addition, a soft start up input 350 is provided to triangle generator 349. A soft start signal is desired when the AC to DC power conversion system is first activated in order to prevent excessive inrush current or other clamping which may occur during normal operation of the power conversion system. The soft start feature allows the DC voltage output across lines 12 and 14 to ramp up to the rated voltage gradually over a predetermined period of time. In the embodiment shown in FIG. 2(I), this period of time is set at approximately 200 milliseconds (msec). During this period of time, the control circuit shown in FIGS. 2(I) and 2(J) does not actively operate to reduce harmonics which may be driven by the switching elements back into the input AC signals.

While this results in a noisy condition for a limited period of time, this tradeoff is preferable when compared with the circuit design and performance difficulties which may otherwise occur. Additionally, it greatly simplifies the design of the circuit by ignoring the start up condition. In typical operation of the circuitry, the start up condition will occur once during operation of the devices or loads which are attached to the power conversion system. Allowing voltage and/or current harmonics to be fed back into the input AC signal during the approximately 200 msec period of time allowed for a soft start up is an extremely short, possibly insignificant period of time, when compared to the duration of operation of the power conversion system which may be hours, days, weeks or months, before another start up condition occurs.

An additional input to triangle generator 349 is provided so that the switching elements may be disabled in the event that an over current condition occurs. The current sensed by each of the Hall sensors S1, S2 and S3 are converted into the desired proportional relationship by buffer 342. The output of buffer 342 is presented on line 357 for Hall sensor S1, line 358 for hall sensor S2 and line 359 for Hall sensor S3. The signals are then added in summer 351 in order to determine the total current draw of the power conversion system. This total current draw is compared to an over current reference voltage 353 by differential comparator 352. If the total current drawn by the power conversion system exceeds the predetermined power rating of the power conversion system, then the amplitude of the triangle wave generated by triangle generator 349 is reduced.

The amplitude of the output of triangle generator 349 is used to determine the available switching period for each of the incoming AC phases, phase A, phase B and phase C. Activation of the switching elements will only occur if the amplitude of the triangle signal generated by triangle generator 349 combined with the output of differential comparitor 373 exceeds a predetermined threshold for both positive and negative switching controls. Thus, by decreasing the amplitude of the triangle signal, the duration of the period of time when the switching elements can be activated is shortened and the energy which is transferred from the incoming AC signals to the DC output across lines 12 and 14 is decreased. This allows soft start circuit 350 to be implemented as an RC charging circuit, or other capacitive charging network, and does not require the use of active circuitry such as timers, counters or the like. This type of soft start circuit also allows a direct interface with the triangle generator, taking the form of a multiplier or summer. If a digital soft start circuit was implemented, a digital to analog converter and a filter would be required to generate a stepped waveform and smooth the steps to create a linear signal.

Pulse generation on control lines 380 and 381 for incoming phases B and C, respectively, are identical to the pulse generation for incoming phase A. In the embodiments shown in FIG. 2(I), the triangle wave has a frequency of 15.35 kHz. This will be the switching frequency of the switching elements. The switching elements will trigger when directed to do so by differential comparitors 374 and 375 which act as gating circuits for the high frequency switching signal (triangle wave).

By comparing the current load drawn from each of the incoming phases A, B and C, and the current reference generated in part by the voltage level of each of the incoming phases A, B and C, differential comparitors 373, 374 and 375 selectively enable operation of the switching elements to ensure that the incoming phase selected provides an energy input the power conversion system, and does not drain energy from the power conversion system.

A gate drive circuit drives the gate of each of the switching elements. When employing the IGBT switching elements, a voltage level of 12 Volts activates the switching elements, and a voltage level of −5 Volts shuts off the switching element. In order to isolate the switching levels from the remainder of the control circuitry, an opto-coupler is connected to each of the sets of control lines 379, 380 and 381 to control the switching elements for incoming phase A, B and C, respectively.

The gate drive circuit incorporates a high collector current protection circuit by sensing the $V_{cc}$ saturation voltage. If the $V_{cc}$ saturation voltage increases over 5 Volts, the gate voltage is driven to −5 Volts, shutting off the IGBT for the remaining portion of the present pulse. This ensures that the IGBT is turned off before excessive collector current causes damage to the device. An initial delay of 2 microseconds is preferably designed into the high collector current protection circuit to prevent an over current protection condition from being erroneously detected during the turn on of the IGBT switching element.

The use of a feedback loop which selects an AC input source based on the phase of the input source solves numerous problems, including ensuring that the phase of the current drawn from each of the power supply phases coincides with the voltage profile for that input source. An easier way to envision this is to compare the direction of a current vector and the direction of the voltage vector, as shown in FIG. 4. Vector V indicates the voltage vector of one of the phases of the voltage source. Current I is a vector which represents the current drain through that same voltage source.

The current I can then be broken down to be represented by a current component which is coincident with the voltage vector, represented by $I_{parr}$, and a current vector which is perpendicular to the direction of the voltage vector, represented by $I_{perp}$. By minimizing the value of the perpendicular component, $I_{perp}$, the load of the current vector becomes coincident with the supply of the voltage vector.

Figure 4A:
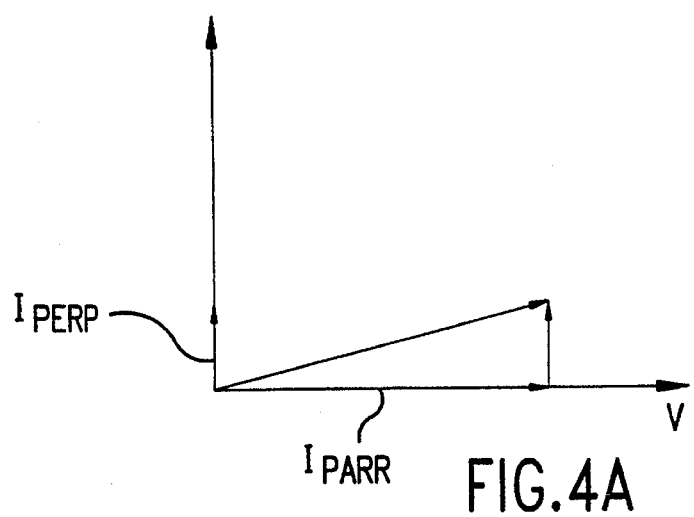
FIGS. 4A and 4B are plots of voltage and current vectors.
Figure 4B:
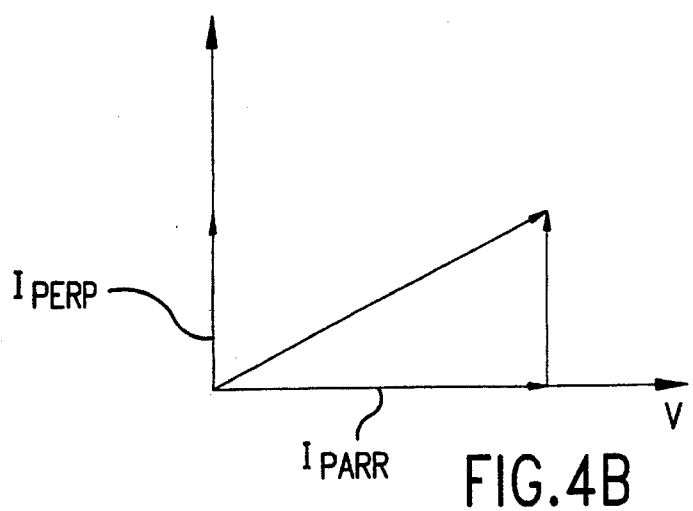

By ensuring that the voltage and current vectors are in phase, the power factor approaches unity. Most of the prior art circuitry results in a power factor of approximately 0.6 to 0.7. This factor is established by dividing the real portion of the power delivered by the apparent power which has been delivered to a system. The real portion of the power delivered to the system is represented by $I_{parr}$, and the apparent power delivered to the system is the vector I, which is the vector summation of the parallel current $I_{parr}$ and the perpendicular current component $I_{perp}$. By minimizing the perpendicular component as shown in FIG. 4A, greater power is exhibit as compared to the power factor shown by FIG. 4B, which represents the prior art devices.

Figure 6:
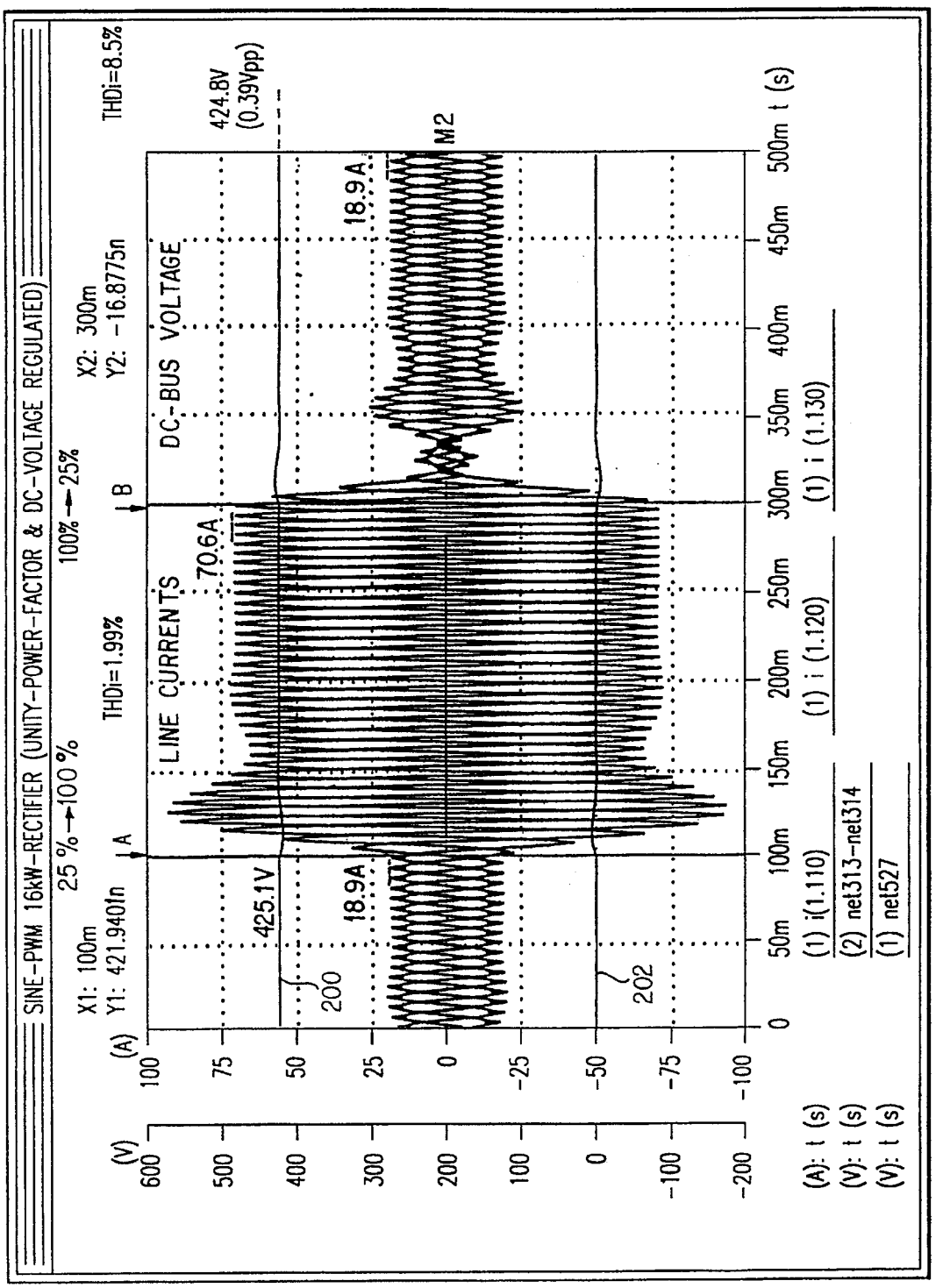
FIG. 6 is a plot showing the input voltage and output current during load switching.

Additional advantages of the circuit employing a constant frequency include low harmonic distortion which is achieved by switching at a frequency which is relatively high when compared to the power supply frequency. The size and weight of the circuitry is greatly reduced by eliminating large transformers which may otherwise be required to accommodate the power supplied at the DC output (across pins 12 and 14). The response time of the DC bus to a step load such as switching from 25% to 100% of the load as shown in FIG. 6 is accomplished within several cycles of the high frequency signal and stabilized within approximately 40 milliseconds as shown in FIG. 6. The DC output voltage is represented as the line 200 which barely shows a ripple in the voltage level following switching at points A and B. Line 202 represents the output of the controller 64. Point A indicates the switching of the load from 25% to 100% and point B indicates the switching of the load from 100% back to 25%.

The voltage stabilizes in significantly less than 1 cycle of a 50 or 60 Hz oscillation, indicating that the feedback circuit rapidly responds to the change in load, and the decrease in the voltage level across pins 12 and 14, altering the switching of the current load as applied to each of the three phases of the power source.

Reference signal generator 46 enables activation of switching element 300 during the positive portion of the cycle, and disables activation of switching element 300, enabling activation of switching element 302 during the negative portion of the cycle of power source V1. Operation of switching element 302 is thus complementary to operation of switching element 300. This switching configuration allows switching element 300 to be closed by switch control circuit 326 during the positive portion of the cycle of power source V1, thus driving a positive voltage onto positive DC output line 12. Similarly, switching element 302 may be closed by switch control circuit 326 during the portion of the cycle that power source V1 is negative, thus presenting a negative voltage on DC output line 14.

In the 3 phase configuration shown in FIG. 1, switching elements 304 and 306 switch power source V2. Switching elements 308 and 310 similarly switch power source V3. Switching elements 304 and 308 are identical in operation to switching element 300, but are controlled by reference signals 322 and 324, respectively. Switching element 306 and 310 operate in a manner identical to switching element 302 and complement the operation of switching elements 304 and 308, respectively.

Thus, a positive DC voltage is maintained on DC line 12, and a respective negative DC voltage is maintained on DC line 14. The exact voltage level of the signals on DC voltage line 12 and DC voltage line 14 with respect to ground is relatively unimportant. The key consideration is the voltage generated across DC (output) voltage lines 12 and 14.

The DC voltage generated across DC lines 12 and 14 must be converted to a desired voltage level or waveform in order to be usable. In order to accomplish this DC to DC or DC to AC converter is employed.

Filter networks 442 and 444 momentarily store energy and provide a phase shift of the load transferred across lines 416 and 418 which in turn transfer the load to the input voltage lines V1, V2 and V3. By adjusting and altering the phase relationship between the load and the input voltage supply lines, resulting in a greater power transfer efficiency between the incoming supply lines V1, V2 and V3 and the load that may be applied across lines 416 and 418.

Referring to FIG. 7A, an isolator 248 is driven by voltage source V1. There are two outputs of isolator 248, each driving an independent, but identical circuit. One output of isolator 248 drives full wave rectifier 250 which produces a pulsed DC voltage which is filtered and regulated by capacitors and a zener diode in block 252. This supplies power to the remainder of the circuitry of FIG. 7A. Block 254 is an isolator which prevents the signals present on lines 150 and 152 from directly crossing into the circuitry shown in FIG. 7A. In one preferred embodiment, isolation device 254 is an optical isolator, HCPL2211. The output of isolator 254 enables the logic circuitry in circuit 256 to begin running. Oscillator 256 is made up of a number of CMOS NAND gates, diodes and invertors in one preferred embodiment.

The circuitry of oscillator 256 can be readily replaced with other oscillation circuitry which can be started and stopped rapidly by altering the state of a single control line. Current sync 158 drives push pull output 260 which in turn drives switching element 302 as shown in FIG. 1A. An identical circuit is shown in FIG. 7B and includes a full wave rectifier 262, filter and voltage limiter 264, optical isolation block 266, oscillator 268, current sync 270, and push pull output 272 which drives switching element 300. In some configurations, the inputs 150 and 152 to the circuitry shown in FIG. 7B are reversed, so that the oscillator circuit shown in FIG. 7B is active only during the positive portion of the cycle of voltage source V1 and the oscillator circuit shown in 7A is only active during the negative portion of the cycle of voltage source V1.

There has been described hereinabove a novel AC to DC power conversion system. Those skilled in the art may make modifications or improvements on the implementations described without departing from the scope of the present invention which is defined solely by the following claims.

What is claimed is:

1. An AC to DC power conversion circuit comprising:
   a) at least one AC input line electrically connected to an external alternating current (AC) power source;
   b) an impedance electrically connected to said AC input and having at least an input and an output, said input of said impedance electrically connected to said AC input;
   c) a switching matrix electrically connected to said output of said impedance, said switching matrix having at least one pair of DC output lines, said switching matrix further including a switching matrix controller and at least one pair of switching elements, alternate members of said pair of switching elements selectively enabled by said switching matrix controller to couple said output of said impedance to said DC output lines;
   d) a voltage feedback circuit coupled to said DC output lines and said switching matrix controller;
   e) a voltage and phase detection means electrically connected to said AC input line; and
   f) a first signal processing means coupled to said voltage and phase detection means and said voltage feedback circuit for determining whether more or less energy should be supplied to said DC output lines, said first signal processing means further including a voltage threshold circuit to prevent operation of said power conversion circuit if said AC input is outside predetermined threshold limits.

2. The apparatus as described in claim 1 and further comprising:
   at least one oscillator driving said switching elements of said switching matrix at a frequency at least ten times higher than the frequency of any signal applied to said AC input lines causing said switching elements to alternately open and close.

3. The apparatus as described in claim 2 and further including
   a second signal processing means electrically connected to said first signal processing means and electrically connected to said AC input lines for determining which input lines should be electrically connected through said switching matrix to said DC output lines.

4. The apparatus as described in claim 3 and further comprising:
   a control circuit means for ensuring that a vector representing the combined real and imaginary portions of a current load is synchronized with a vector representing the real and imaginary portions of the voltage applied to said AC input lines to provide maximum power transfer and minimize switching losses.

5. A method for converting alternating current into direct current comprising the steps of:
   a) determining the phase and voltage of one or more AC inputs;
   b) controlling a switching matrix coupled to said AC inputs to generate a DC output;
   c) determining the energy required by said DC output by subtracting said DC output from a DC reference voltage and determining an appropriate increase or decrease of said DC output to maintain a desired DC output;
   d) evaluating the phase of each of said AC inputs to determine which of said AC inputs can best maintain said desired DC output;
   e) comparing the voltage of each of said AC inputs with a voltage threshold level to prevent operation of said power conversion circuit if said AC input is outside predetermined threshold limits; and
   f) selectively electrically connecting said determined AC input to said DC output by energizing appropriate switching elements within said switching matrix.

6. A power conversion circuit comprising:
   a) at least two AC input lines electrically connected to an external, alternating current (AC) power source;
   b) at least one pair of DC output lines;
   c) an impedance means having an input and an output, having said input electrically connected to said AC input lines;
   d) switching means having an input electrically connected to said output of said impedance, and having an output and a control input;
   e) filter means having an input electrically connected to said output of said switching means and an output electrically connected to said DC output lines, for electrically filtering out undesired electronic signal components; and
   f) control circuit means electrically connected to said control input of said switching means for selectively enabling said switching means, said switching means selectively electrically connecting said output of said impedance to said input of said filter means, said control circuit means further including
      a voltage feedback circuit coupled to said DC output lines,
      a voltage and phase detection means electrically connected to said AC input lines, said voltage detection means for comparing the voltage of each of said AC inputs with a voltage threshold level to prevent operation of said power conversion circuit if said AC input is outside predetermined threshold limits,
      a first signal processing means coupled to said voltage and phase detection means and said voltage feedback circuit for determining whether more or less energy should be supplied to said DC output lines, and
      a second signal processing means electrically connected to said first signal processing means and electrically connected to said AC input lines for determining which AC input lines should be electrically connected through said switching means to said DC output lines.

7. The apparatus as described in claim 6 and further comprising:
   at least three input lines electrically connected to an external AC power source, at least two of said three input lines being of a different AC phase from each other;
   at least three pairs of switching means;
   only one pair of DC output lines.

8. The apparatus as described in claim 6 in which said control circuit means further monitors each of said input lines and selectively enables said switching means to ensure that the incoming AC power on each input line does not drop below a predetermined minimum level.

9. The apparatus as described in claim 6 in which said control circuit means further monitors each of said input lines and DC output lines and selectively enables said switching means to ensure that the voltage across said DC output lines does not drop below a predetermined minimum voltage.

10. The apparatus as described in claim 6 in which said impedance means further comprises at least a first inductor connected in series between the input and output of said impedance means.

11. The apparatus as described in claim 10 in which said impedance means further comprises:
    at least a second inductor connected in series with said first inductor;
    a first capacitor having two leads, one lead electrically connected to the electrical connection of said first inductor and said second inductor and the other lead electrically connected to a large ground plane or electrical neutral.

12. A power conversion system for operating in conjunction with a line frequency waveform, the system comprising:
    a) an Alternating Current (AC) power input for accepting AC inputs having a waveform at a given power level;
    b) a Direct Current (DC) output for providing a DC output;
    c) an input filter circuit for rectifying the AC inputs and having an output;
    d) a high frequency switch circuit coupled to the output of the filter network for producing said DC output;
    e) a switch control circuit for controlling the operation of the switch circuit;
    f) means for determining the energy required by said DC output;
    g) means for determining an appropriate increase or decrease of said DC output to maintain a desired DC output;
    h) means for evaluating the phase of said AC inputs to determine which of said AC inputs can best maintain said desired DC output;
    i) means for comparing the voltage of said AC inputs with a voltage threshold level to prevent operation of said power conversion circuit if said AC input is outside predetermined threshold limits: and
    j) means for ensuring that a vector representing the combined real and imaginary portions of a current load is synchronized with a vector representing the real and imaginary portions of the voltage applied to said AC power input to provide maximum power transfer and minimize switching losses.

13. The system of claim 12 wherein the alternating current power input further includes means for accepting a waveform at a plurality of voltages and frequencies.

14. The system of claim 12 wherein the DC current output comprises a DC output bus for coupling the DC output to more than one load.

15. The system of claim 12 wherein the input filter circuit comprises a passive filter circuit and a parallel connected capacitance circuit.

16. The system of claim 12 wherein the input filter circuit includes inductance devices and taps on the inductance devices for accommodating a plurality of input voltages.

17. The system of claim 12 wherein the control circuit operates the switches at a frequency an order of magnitude higher than the frequency of the incoming line waveform.

18. The system of claim 12 wherein the control circuit includes feedback from the DC output.

19. The system of claim 12 wherein the control circuit includes means for switching the switches in the switch circuit when there is approximately 0 voltage across the switch.

20. The system of claim 12 wherein the switch control circuit includes a hysteresis loop control.

21. The system of claim 12 wherein the switch control circuit includes at least a positive and negative pair of switches activated such that the positive switch is activated during a positive portion an alternating current cycle and the negative switch is activated for the negative portion of the cycle.

22. The system of claim 12 wherein each switch is an IGBT switch.

23. The system of claim 12 wherein the switch control circuit includes a plurality of switches, and further including a snubber circuit associated with each switch.

24. The system of claim 12 wherein the alternating current power input comprises means for accepting a three phase input, wherein the switch control circuit includes six switch elements arranged in positive and negative pairs, wherein each pair is controlled by the same control circuit to prevent short circuits.

25. The system of claim 24 wherein the control circuits operate at the same frequency as the respective phase of the incoming alternating current power signal.

26. The system of claim 12 wherein the switch control circuit includes an inductor capacitor combination for supplying current to the DC output during switching transitions.

27. A method for converting an Alternating Current (AC) power input having at least two phases into a Direct Current (DC) output comprising;
   a) filtering the AC power input by a rectifier circuit;
   b) coupling an output from said rectifier circuit to a high frequency switch circuit;
   c) controlling the operation of the switch circuit to generate said DC output;
   d) determining the energy required by said DC output;
   e) determining an appropriate increase or decrease of said DC output to maintain a desired DC output;
   f) comparing a voltage level of said AC inputs with a voltage threshold level to prevent conversion of said AC power input if said voltage level is outside predetermined threshold limits;
   g) evaluating the phase of each of said AC inputs to determine which of said AC inputs can best maintain said desired DC output; and
   h) synchronizing a vector representing the combined real and imaginary portions of a current load of said desired DC output with a vector representing the real and imaginary portions of the voltage applied to said AC power input to provide maximum power transfer and minimize switching losses.

* * * * *